(12) United States Patent
Tanaka et al.

(10) Patent No.: US 7,585,791 B2
(45) Date of Patent: Sep. 8, 2009

(54) LASER IRRADIATION METHOD, LASER IRRADIATION APPARATUS AND METHOD FOR MANUFACTURING SEMICONDUCTOR DEVICE

(75) Inventors: Koichiro Tanaka, Isehara (JP); Yoshiaki Yamamoto, Hadano (JP)

(73) Assignee: Semiconductor Energy Laboratory Co., Ltd., Atsugi-shi, Kanagawa (JP)

( * ) Notice: Subject to any disclaimer, the term of this patent is extended or adjusted under 35 U.S.C. 154(b) by 183 days.

(21) Appl. No.: 10/584,729

(22) PCT Filed: Oct. 18, 2005

(86) PCT No.: PCT/JP2005/019456

§ 371 (c)(1),
(2), (4) Date: Jun. 23, 2006

(87) PCT Pub. No.: WO2006/043690

PCT Pub. Date: Apr. 27, 2006

(65) Prior Publication Data

US 2007/0178672 A1   Aug. 2, 2007

(30) Foreign Application Priority Data

Oct. 20, 2004   (JP) .............................. 2004-306140

(51) Int. Cl.
*H01L 21/00* (2006.01)
*C30B 13/00* (2006.01)

(52) U.S. Cl. ....................... 438/795; 438/799; 438/487; 257/E21.473; 257/E21.475; 117/219

(58) Field of Classification Search ................. 438/795, 438/799, 487, 535; 117/219, 222, 904; 257/E21.473, 257/E21.471, E21.475
See application file for complete search history.

(56) References Cited

U.S. PATENT DOCUMENTS 5,643,826 A   7/1997 Ohtani et al.

(Continued)

FOREIGN PATENT DOCUMENTS

EP   1 338 371   8/2003

(Continued)

OTHER PUBLICATIONS

International Search Report (Application No. PCT/JP2005/019456) dated Jan. 17, 2006.

(Continued)

*Primary Examiner*—Caridad M Everhart
(74) *Attorney, Agent, or Firm*—Eric J. Robinson; Robinson Intellectual Property Law Office, P.C.

(57) ABSTRACT

In conducting laser annealing using a CW laser or a quasi-CW laser, productivity is not high as compared with an excimer laser and thus, it is necessary to further enhance productivity. According to the present invention, a fundamental wave is used without putting laser light into a non linear optical element, and laser annealing is conducted by irradiating a semiconductor thin film with pulsed laser light having a high repetition rate. A laser oscillator having a high output power can be used for laser annealing, since a non linear optical element is not used and thus light is not converted to a harmonic. Therefore, the width of a region having large grain crystals that is formed by scanning once can be increased, and thus the productivity can be enhanced dramatically.

34 Claims, 19 Drawing Sheets

U.S. PATENT DOCUMENTS

| | | | |
|---|---|---|---|
| 6,285,042 | B1 | 9/2001 | Ohtani et al. |
| 6,335,541 | B1 | 1/2002 | Ohtani et al. |
| 6,869,865 | B2 | 3/2005 | Maegawa et al. |
| 6,992,026 | B2 | 1/2006 | Fukuyo et al. |
| 6,998,639 | B2 | 2/2006 | Ohtani et al. |
| 2002/0041444 | A1* | 4/2002 | Kahlert et al. ............... 359/618 |
| 2002/0070352 | A1* | 6/2002 | Allan et al. ............... 250/492.1 |
| 2003/0213770 | A1* | 11/2003 | Yamada et al. ................. 216/65 |
| 2004/0002199 | A1 | 1/2004 | Fukuyo et al. |
| 2004/0087118 | A1* | 5/2004 | Maegawa et al. ........... 438/514 |
| 2005/0173387 | A1 | 8/2005 | Fukuyo et al. |
| 2005/0181581 | A1 | 8/2005 | Fukuyo et al. |
| 2005/0184037 | A1 | 8/2005 | Fukuyo et al. |
| 2005/0189330 | A1 | 9/2005 | Fukuyo et al. |
| 2005/0194364 | A1 | 9/2005 | Fukuyo et al. |
| 2006/0040473 | A1 | 2/2006 | Fukuyo et al. |
| 2006/0131583 | A1 | 6/2006 | Ohtani et al. |
| 2006/0144828 | A1* | 7/2006 | Fukumitsu et al. ..... 219/121.67 |

FOREIGN PATENT DOCUMENTS

| | | |
|---|---|---|
| EP | 1 588 793 | 10/2005 |
| JP | 07-130652 | 5/1995 |
| JP | 08-078329 | 3/1996 |
| JP | 2001-338894 | 12/2001 |
| JP | 2004-158627 | 6/2004 |
| JP | 2004-165436 | 6/2004 |
| JP | 3683580 | 8/2005 |
| WO | WO 02/22301 | 3/2002 |
| WO | WO 2004/050291 | 6/2004 |

OTHER PUBLICATIONS

Written Opinion (Application No. PCT/JP2005/019456) dated Jan. 17, 2006.

* cited by examiner

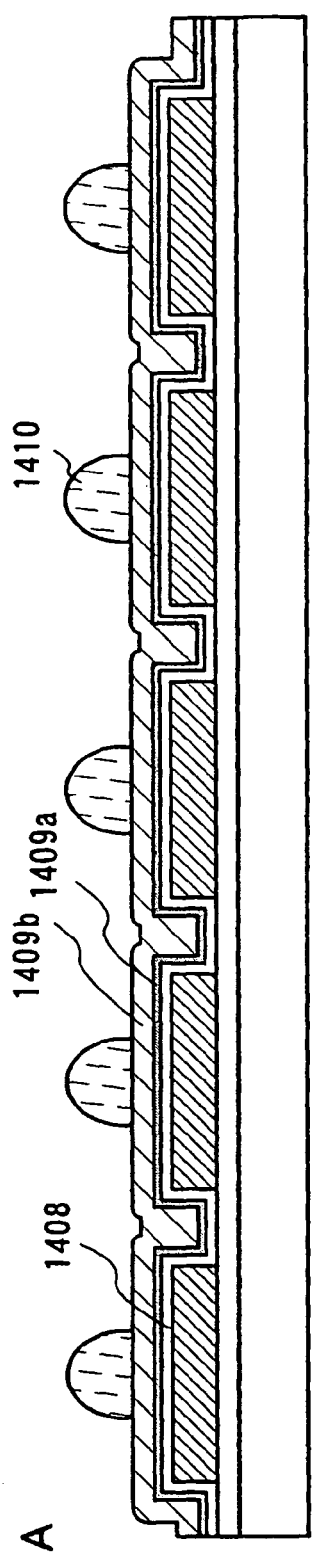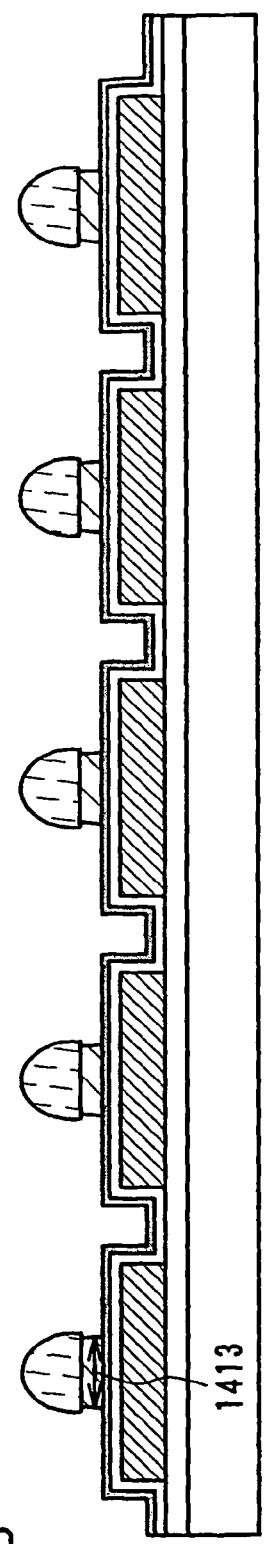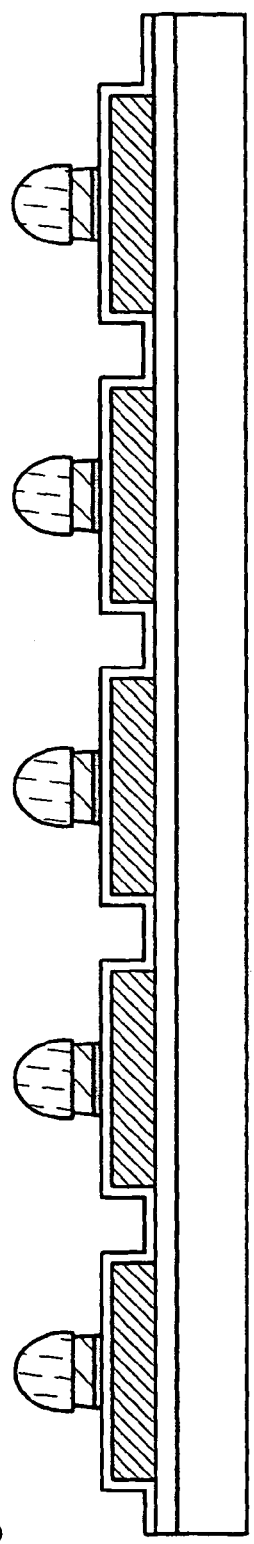

1550  1551

1553  1552  1541

LASER IRRADIATION METHOD, LASER IRRADIATION APPARATUS AND METHOD FOR MANUFACTURING SEMICONDUCTOR DEVICE

TECHNICAL FIELD

The present invention relates to a laser irradiation apparatus for irradiating an object with laser light, a method for forming a crystalline semiconductor film using the apparatus, and a manufacturing method of a semiconductor device. In addition, the present invention relates to a semiconductor device having a circuit including a thin film transistor (also referred to as a TFT) or a photovoltaic device (such as an optical sensor or a solar battery). Further, the present invention relates to an electronic device incorporating, as a part thereof, e.g., an electro-optic device typified by a liquid crystal display panel, a light-emitting display device having an organic light-emitting element, a sensor device such as a line sensor, or a memory device such as SRAM.

Note that a semiconductor device in this specification means a generic device which can operate with use of semiconductive characteristics and includes all types of devices such as an electro-optic device, a semiconductor circuit and an electronic device.

BACKGROUND ART

In recent years, a technology for forming a thin film transistor (TFT) using a semiconductor thin film (a thickness of around several nanometers to several hundred nanometers) formed over a substrate having an insulating surface has been attracting attention. Thin film transistors are broadly applied to electronic devices such as an IC or an electro-optic device, and are particularly developed as switching elements for image display devices at a rapid rate.

A semiconductor thin film that can be used for higher speed operation has been required since a image display device or an image sensor is made larger and higher density of pixels (high definition) is advanced recently. In addition, in order to achieve light-weight or cost reduction, a thin film transistor is applied also to a driver element in the periphery of a display region, as well as a switching element of an image display device.

A method for enhancing electric characteristics such as mobility by forming a semiconductor thin film having a crystal structure, for example, a solid phase epitaxy method or a laser annealing method has been studied.

The solid phase epitaxy method is a method by which an amorphous silicon thin film is formed over a substrate and is heated to become a polycrystal thin film. The heating is conducted at a temperature of about 600 to 1000° C. for a long time, and an expensive quartz substrate that can endure high temperature is required.

Glass substrates are of great promise in terms of costs as compared with quartz substrates or single crystal semiconductor substrates. However, glass substrates have poor heat resistance and are easy to be deformed by heat. Thus, in the case of forming a TFT using a polycrystal semiconductor film over a glass substrate, a laser annealing method is suitable for crystallization of a semiconductor film to prevent a thermal deformation of the glass substrate.

The laser annealing has advantages that the processing time can be shortened to a large degree as compared with another annealing method using radiation heat or conduction heat, and that a semiconductor substrate or a semiconductor film can be heated selectively, so that the substrate is hardly damaged thermally.

Laser oscillators are classified broadly into two kinds, which are a pulsed laser oscillator and a continuous wave laser oscillator, in a standpoint of the oscillation method. Laser light (also, referred to as a laser beam) oscillated from a pulsed excimer laser is used for laser annealing in many cases. The excimer laser has advantages that it has a high output power and repetition irradiation is possible at a high frequency.

Laser light oscillated from an excimer laser has an advantage such as high absorption efficiency to a silicon thin film that is used as a semiconductor film in many cases.

For example, in laser irradiation, laser light is shaped into linear laser light on the irradiation surface by an optical system (such as a beam homogenizer) and irradiation position of laser light is moved relatively to the irradiation surface. This method is superior industrially because an amorphous silicon film having a large area can be crystallized at one time and thus, high productivity is obtained by this method. Hereinafter, laser light having a linear shape on an irradiation surface is referred to as a linear beam.

DISCLOSURE OF INVENTION

A conventional laser annealing method using laser light oscillated from a pulsed excimer laser has some problems to be solved, for example, a problem that crystal diameter or crystallinity is not uniform, a problem that electric characteristics of a TFT are not stable, and the like.

As one of methods for solving the problems, there is a method in which a continuous wave laser (hereinafter, CW laser) such as an Ar laser or a $YVO_4$ laser or a pulsed laser having an extremely high repetition rate of 10 MHz or higher (hereinafter, a quasi-CW laser) is employed.

It is found that a grain diameter of a crystal formed in a semiconductor film is enlarged by using laser light oscillated from a CW laser or a quasi-CW laser. Electric characteristics such as mobility become higher, as the grain diameters of crystals in polycrystal silicon thin film is larger in general. When the grain diameters of crystals in the semiconductor film becomes large, the number of crystal boundaries located in a channel forming region of a TFT formed with the semiconductor film is reduced. Thus, the mobility becomes higher and the semiconductor film can be used for a development of a higher performance device. Hereinafter, a crystal having a large grain diameter is referred to as a large grain crystal.

However, in the case of using a CW laser and a quasi-CW laser using a solid state laser medium, the wavelength band of the fundamental wave is from red ray to near-infrared ray, and absorption efficiency of the semiconductor film is extremely low. Laser light having high absorption efficiency of the semiconductor film is laser light having a wavelength of visible light to ultraviolet light.

Therefore, in the case of using a CW laser and a quasi-CW laser for a laser annealing method, a wavelength is converted to a harmonic of visible light or shorter with a non linear optical element. For example, the highest conversion efficiency can be obtained in the method of converting a fundamental wave of near-infrared ray that easily provides a high output to green laser light of the second harmonic.

Harmonics can be obtained by putting a fundamental wave oscillated from a laser medium into a non linear optical element. However, there is a problem that, when the output of laser becomes high, a non linear optical element is damaged by a non linear optical effect such as multiphoton absorption, and thus, is broke down. Therefore, a CW laser of visible range that is produced at present has an output power of at most about 15 W due to a problem of a non linear optical element.

Further, in conducting laser annealing using a CW laser or a quasi-CW laser, productivity is not high as compared with an excimer laser and thus, it is necessary to further enhance productivity. For example, CW laser light of 532 nm with 10 W is formed into a linear beam of about 300 μm in a long-side direction and about 10 μm in a short-side direction to conduct laser annealing. At this time, the width of a region having large grain crystals which is formed by scanning once is about 200 μm. Accordingly, scanning of a beam spot is required to be conducted several thousand times in order to crystallize the whole surface of a semiconductor film in rectangle with several hundreds mm or more on one side that is used in a mass production process.

According to the present invention, a fundamental wave is used without putting laser light into a non linear optical element, and laser annealing is conducted by irradiating a semiconductor thin film with pulsed laser light having a high repetition rate. One feature of the present invention is that the repetition rate of a laser used in the present invention is 10 MHz or more.

High intensity means a high peak output power per unit of time and per area, and the peak output power of laser light according to the present invention ranges from 1 GW/cm$^2$ to 1 TW/cm$^2$.

A fundamental wave with a wavelength of about 1 μm is not absorbed so much by a semiconductor thin film in irradiating the semiconductor thin film with the fundamental wave. Thus, the fundamental wave has a low absorption efficiency. The present inventors have found that a fundamental wave emitted from a pulsed laser having a pulse width in the range of picosecond, or in the range of femtosecond ($10^{-15}$ seconds) can provide high intensity laser light. Thus, a non linear optical effect (multiphoton absorption) is generated and the fundamental wave is absorbed by the semiconductor film.

According to the present invention, a laser oscillator having a higher output power than 15 W, e.g., 40 W output power can be used for laser annealing, since a non linear optical element is not used and thus light is not converted to a harmonic. Therefore, the width of a region having large grain crystals that is formed by scanning once can be increased, and thus the productivity can be enhanced dramatically.

In addition, according to the present invention, multiphoton absorption is generated to melt a semiconductor thin film, and thus, the thickness of the semiconductor thin film is small and for example, even a semiconductor thin film having a thickness of 100 nm or less can absorb high intensity laser light. Therefore, a formation time of a semiconductor thin film can be shortened by making the thickness of the semiconductor thin film smaller.

A structure of the present invention relating to a laser irradiation method disclosed in this specification is a laser irradiation method comprising the steps of: emitting a first laser beam which is a fundamental wave from a laser oscillator having a repetition rate of 10 MHz or higher; forming the first laser beam into a second laser beam with a condenser lens; delivering the second laser beam onto an irradiation surface; and moving the second laser beam relatively to the irradiation surface.

Another structure of the present invention relating to a laser irradiation method is a laser irradiation method comprising the steps of: emitting a first laser beam which is a fundamental wave from a laser oscillator having a repetition rate of 10 MHz or higher; forming the first laser beam into a second laser beam with a condenser lens; delivering the second laser beam onto an object to generate multiphoton absorption for melting the object; and moving the second laser beam relatively to the object.

In the above structure, the first laser beam is emitted with a pulse width of 1 femtosecond or more and 10 picoseconds or less. The pulsed width of 1 femtosecond or more and 10 picoseconds or less is employed to obtain a sufficiently high intensity for generating multiphoton absorption. A laser beam with a pulsed width of several ten picoseconds longer than ten picoseconds does not generate multiphoton absorption. In addition, when an experimental test for heating a semiconductor film by a laser beam with a pulse width of 150 femtoseconds was conducted, it could be observed that the semiconductor film was heated. Therefore, it is thought that multiphoton absorption is generated.

In addition, a laser irradiation apparatus including a laser oscillator in which a non linear optical element is not incorporated and an optical member is also one feature of the present invention. A structure thereof is a laser irradiation apparatus comprising: a laser oscillator for emitting a fundamental wave; an optical member for processing a laser beam emitted from the laser oscillator into a long laser beam on an irradiation surface; and means for moving the irradiation surface relatively to the laser beam.

Further, another structure is a laser irradiation apparatus comprising: a laser oscillator for emitting a fundamental wave; a condenser lens for forming a laser beam emitted from the laser oscillator; a mechanism for projecting and delivering the laser beam using the condenser lens onto an irradiation surface; and means for moving the irradiation surface relatively to the laser beam.

The above-described laser irradiation apparatus of the present invention does not incorporate a non linear optical element and thus, the cost for the non linear optical element can be reduced from the cost for manufacturing the irradiation apparatus.

In general, when an energy gap of one photon is smaller than an energy gap of a semiconductor film, the photon is not absorbed by the semiconductor film. Thus, in a conventional manner, energy of one photon is increased by converting a fundamental wave to a harmonic with a non linear optical element as described above. In the case of using an n-th harmonic with a wavelength λ, the energy E of one photon is represented by the next equation using Planck's constant $\hbar$ and light velocity c.

$$E = \frac{\hbar c}{\lambda/n}$$ EQUATION 1

For example, light with a wavelength of 1064 nm corresponds to energy of 1.17 eV. Thus, in the case of using an amorphous silicon film with an energy band gap of 1.6 to 1.8 eV as a semiconductor film, absorption is not made. Light with a wavelength of 532 nm corresponds to energy of 2.34 eV, and thus, absorption is made to an amorphous silicon film.

However, when laser light with high intensity is used, high electromagnetic field is generated in a material irradiated with laser light, thereby generating a nonlinear optical effect (multiphoton absorption). By the multiphoton absorption, photons can be absorbed at the same time multistep without letting light passing through the semiconductor film, in the case where the energy of one photon smaller than the energy band gap of the semiconductor film.

For example, when an amorphous silicon film is irradiated with laser light having a wavelength of 1064 nm, the energy of one photon is 1.17 eV and thus, absorption by the amorphous silicon film is not made. However, two photons are simultaneously absorbed by multiphoton absorption and thus, 2.34 eV similarly to the second harmonic is obtained to generate light absorption.

As a laser that can provide high enough intensity to cause multiphoton absorption, there is a short pulsed laser with a pulse width of pico second or femto second in its unit. As the pulsed laser, lasers in which Nd, Yb, Cr, Ti, Ho, Er, and the like are added as a dopant into crystals of Sapphire, YAG, ceramics YAG, ceramics $Y_2O_3$, KGW, KYW, $Mg_2SiO_4$, YLF, $YVO_4$, $GdVO_4$ and the like are given.

In the above described structure, the condenser lens includes two pieces of convex cylindrical lenses. In addition, an optical member may be arranged appropriately in a path from a laser oscillator to an irradiation surface without being limited to a dioptric member typified by a condenser lens. As other optical members that can be applied to the present invention, there is given catoptrical optical member such as a mirror or a diffractive optical member such as diffraction grating.

In the present invention, a pulsed laser having a repetition rate of 10 MHz or higher is used. This is because it takes about 100 nano seconds for an amorphous silicon film that has been melted by absorbing laser light to be recrystallized by cooling due to thermal diffusion, in the case of using the amorphous silicon film as a semiconductor film. By irradiating the same portion in the amorphous silicon film with laser light again within 100 nanoseconds, a melted state of the film can be maintained. Therefore, when a pulsed laser having a repetition rate of 10 MHz or more is adopted, it can be considered as a CW laser in a quasi manner and thus, such a laser is referred to as a quasi-CW laser.

Another aspect of the present invention is to manufacture a semiconductor device by a laser annealing method in which a fundamental wave is emitted. A structure of the manufacturing method is a laser irradiation method comprising the steps of: processing a laser beam which is a fundamental wave on a surface of a semiconductor into a long laser beam; and moving the surface of the semiconductor relatively to the long laser beam to be irradiated with the long laser beam so as to crystallize the semiconductor.

An impurity element added to a semiconductor can be activated by a laser annealing method in which a fundamental wave is emitted. And another structure of manufacturing method of a semiconductor device is a laser irradiation method comprising the steps of: forming an impurity region in a semiconductor; processing a laser beam which is a fundamental wave on a surface of a semiconductor into a long laser beam; and moving the surface of the semiconductor relatively to the long laser beam so as to activate the impurity region formed in the semiconductor.

A laser annealing method in which a fundamental wave is emitted can be employed to a semiconductor layer over a conductive layer with an insulating film therebetween. A laser irradiation method comprising the steps of: forming a conductive layer over a glass substrate; forming an insulating layer to cover the conductive film; forming a semiconductor layer over the insulating layer; processing a laser beam which is a fundamental wave into a long laser beam on a surface of the semiconductor layer; and moving the surface of the semiconductor relatively to the long beam to be irradiated with the long beam.

Note that a laser annealing method in this specification indicates a technique by which a damaged layer or an amorphous layer formed in a semiconductor substrate or a semiconductor film is recrystallized or a technique by which an amorphous semiconductor film formed over a substrate is crystallized. In addition, the laser annealing method includes a technique for planarizing or surface modification of a semiconductor substrate or a semiconductor film.

In addition, multiphoton absorption in this specification means simultaneous absorption of two or more photons, and that reactive electronic excitation state, which cannot be reached by energy of one photon with the same energy as the two photons, can be reached by the absorption energy of two or more photons. It should be noted that the term "simultaneous" means that two phenomena occur within $10^{-14}$ seconds. In addition, the described above electronic excitation state is an electronic state of molecules at higher energy than an electronic ground state of molecules, which is achieved by absorbing electromagnetic radiated emission and in which a life time is longer than $10^{-13}$ seconds.

By the present invention, a non linear optical element for converting a wavelength is not needed, and a laser beam with an extremely large output power, for example, a laser beam having an output power twice or more times as large as a harmonic can be obtained. Therefore, the grain diameter of a crystal in a semiconductor film can be enlarged and the number of grain boundaries in a channel forming region of a TFT formed using the semiconductor film is reduced to increase the mobility. Thus, the semiconductor film is suitable for developing a high performance device.

Further, a non linear optical element has a defect that a maintenance-free state, which is an advantage of a solid state laser, cannot be kept long since the non linear optical element is easily changed in its quality. However, the present invention can overcome the defect, since the present invention does not need a non linear optical element. In other words, stability and reliability of a laser irradiation apparatus itself can be enhanced, according to the present invention.

BRIEF DESCRIPTION OF DRAWINGS

In the accompanying drawings:

FIGS. 11A to 11C are cross-sectional views showing manufacturing steps of a CPU;

BEST MODE FOR CARRYING OUT THE INVENTION

Embodiment Modes of the present invention are described below. The present invention can be carried out in many different modes, and it is easily understood by those skilled in the art that modes and details herein disclosed can be modified in various ways without departing from the spirit and the scope of the present invention.

EMBODIMENT MODE 1

Figure 1:
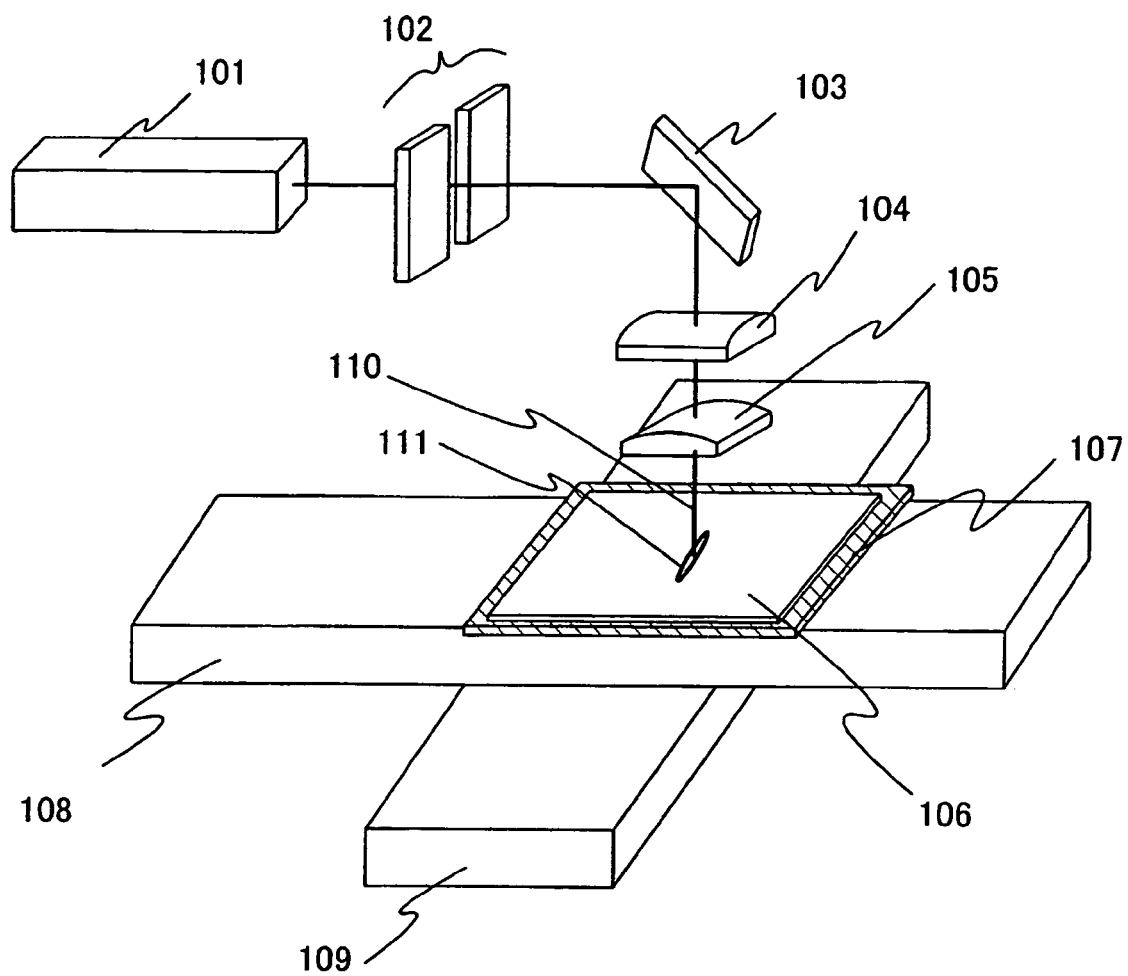
FIG. 1 is a perspective view showing one example of a laser irradiation apparatus according to an aspect of the present invention.

FIG. 1 shows one example of a laser irradiation apparatus according to the present invention.

As a laser oscillator 101 shown in FIG. 1, a laser oscillator that oscillates with a pulse width in the range of femtosecond ($10^{-15}$ second) is used (also referred to as a femtosecond laser). As the laser oscillator, lasers in which Nd, Yb, Cr, Ti, Ho, Er, and the like are added as a dopant into crystals of Sapphire, YAG, ceramics YAG, ceramics $Y_2O_3$, KGW, KYW, $Mg_2SiO_4$, YLF, $YVO_4$, $GdVO_4$ and the like are given. Note that a non linear optical element is not included in the laser oscillator 101 and thus a fundamental wave of a laser beam is emitted. A non linear optical element for converting light oscillated from a laser medium to a harmonic is not included in the pulsed laser oscillator 101; however, the pulsed laser oscillator 101 has high enough light intensity to generate a non linear optical effect (multiphoton absorption) in a semiconductor film.

A laser beam emitted from the laser oscillator 101 passes through a slit 102. By the slit 102, a weak portion in energy of a laser beam can be blocked and the length in the long-side direction of the laser beam on an irradiation surface can be adjusted. The slit 102 used in the present invention is not especially limited, and a slit having a structure or a shape that can block a weak portion of intensity when light passes through a slit.

Thereafter, a laser beam that has passed through the slit 102 is changed in its direction by a mirror 103 and is deflected toward a semiconductor film 106 formed on a surface of a glass substrate. It should be noted that the direction of the laser beam that has been changed may be perpendicular or diagonal to the substrate.

Then, the laser beam whose direction has been changed by the mirror 103 projects an image of the slit 102 onto the semiconductor film 106 that is an irradiation surface by a cylindrical lens 104 that operates only in one direction. Further, the laser beam is converged in one direction by a second cylindrical lens 105 which is rotated by 90° from the first cylindrical lens 104 and which operates only in one direction. Then, the laser beam is delivered to the semiconductor film 106. A beam irradiation region 111 having a linear, elliptical or rectangle shape on the irradiation surface is obtained by the first and second cylindrical lenses 104 and 105. By the first cylindrical lens 104, a laser beam is formed in a long-side direction of the beam irradiation region 111, and by the second cylindrical lens 105, the laser beam is formed in a short-side direction of the beam irradiation region 111. The cylindrical lens used in the present invention may be planoconvex on the side which the laser beam is incident into or emitted from or biconvex. In the case of the planoconvex cylindrical lens, it is preferable that the cylindrical lens has a convex surface on the side where the laser beam is incident in point of low aberration and high accuracy.

Figure 2:
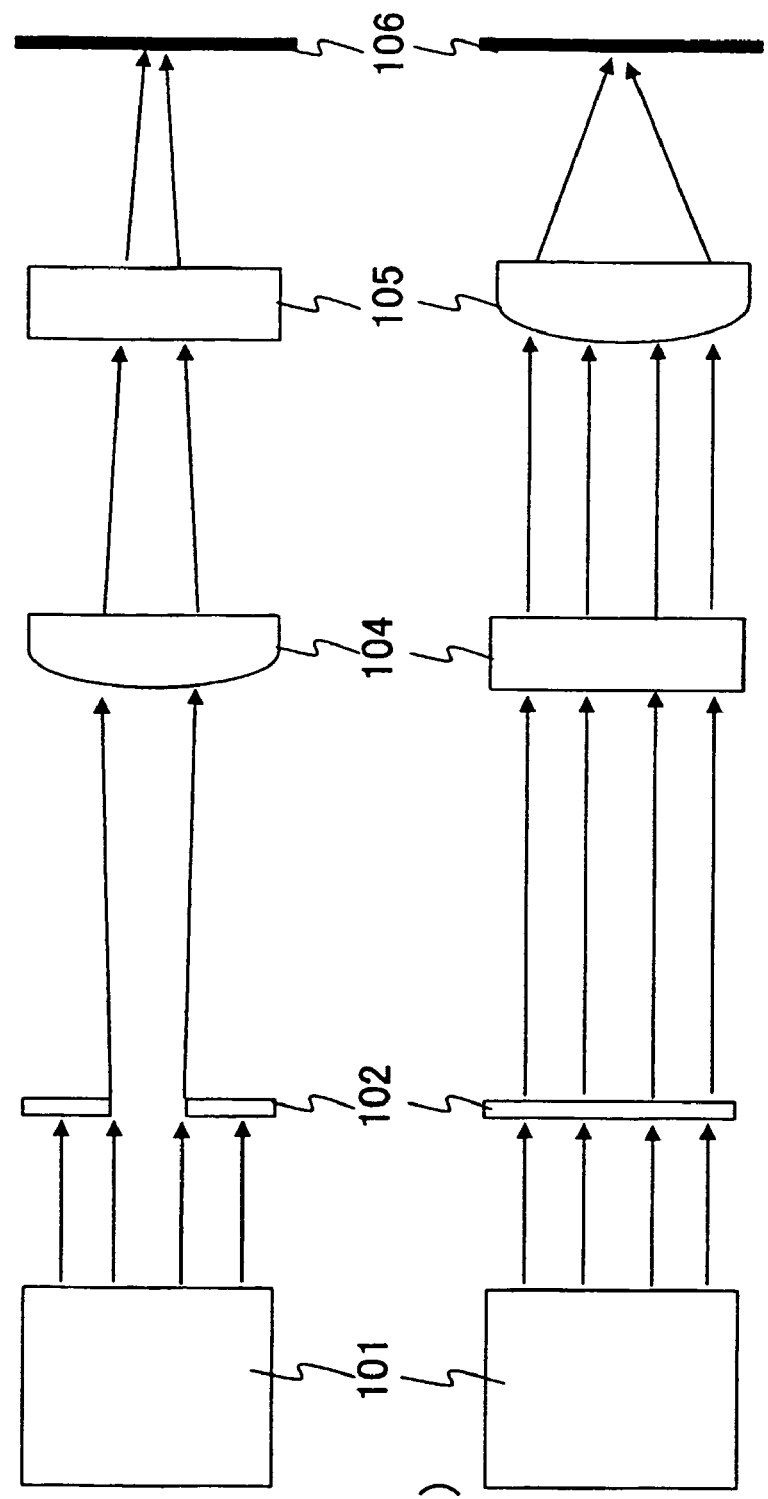
FIGS. 2-(1) and 2-(2) each show an optical system according to an aspect of the present invention.

An optical system of the present invention is described in detail with reference to FIGS. 2-(1) and 2-(2). The reference numerals used in FIGS. 2-(1) and 2-(2) are the same as those in FIG. 1. FIG. 2-(1) shows a long-side direction of a laser irradiation region and FIG. 2-(2) shows a short-side direction of the laser irradiation region. A laser beam emitted from the laser oscillator 101 is blocked partially by the slit 102 and only a portion of the laser beam having high intensity passes through the slit. The laser beam that has passed through the slit projects an image formed by the slit 102 onto the semiconductor film 106 by the first cylindrical lens 104. The laser beam 110 shown by the solid line in FIG. 1 shows a laser beam that passes through a center of the beam irradiation region 111.

The positional relations among the first cylindrical lens 104, the slit 102, and the semiconductor film 106 as an irradiation surface are described in detail. The slit 102 is used so as to prevent a portion of the laser beam having weak energy from being delivered onto the semiconductor film. If such a laser beam having the portion with weak energy is delivered onto the semiconductor film, a polycrystal region having relatively small crystal grains whose surface is uneven (here, referred to as a poorly crystalline region) is formed, which is not preferable. In view of the problem, the slit 102 is used so as not to form such a region in a semiconductor film. In general, when a laser beam is partially blocked by a slit, a phenomenon called diffraction due to coherence of laser light is caused and thus, diffraction fringes are generated in the laser beam. A method for preventing diffraction fringes on the irradiation surface is described below.

In the two equations shown below, f is the focal length of the first cylindrical lens 104, s is the width of the opening of the slit 102, M1 is the distance between the slit 102 and the cylindrical lens 104, M2 is the distance between the first cylindrical lens 104 and the semiconductor film 106, and L is the length of the linear beam in the long-side direction on the semiconductor film 106, which is the irradiation surface. The positional relations are given by the following two equations:

$$\frac{s}{L} = \frac{M1}{M2} \quad \text{[Equation 2]}$$

$$\frac{1}{f} = \frac{1}{M1} + \frac{1}{M2} \quad \text{[Equation 3]}$$

Based on these equations shown above, other two equations shown below can be given by:

$$M1 = \frac{f(s+L)}{L} \quad \text{[Equation 4]}$$

$$M2 = \frac{f(s+L)}{s} \quad \text{[Equation 5]}$$

Therefore, the fringes due to the diffraction are not translated to the semiconductor film by arranging the slit, the first cylindrical lens, and the irradiation surface, based on the above equations. Accordingly, the laser irradiation which hardly forms the poorly crystalline region can be achieved.

If a diameter, an output power or a shape of an emitted laser beam can be used as they are, two cylindrical lenses are not necessarily used. In addition, when the ratio between a long-side and a short-side of the emitted laser beam is kept to converge light, a spherical lens may be used instead of a cylindrical lens.

The glass substrate provided with the semiconductor film 106 is moved at an appropriate speed to irradiate the whole surface of the substrate with laser light. The substrate provided with the semiconductor film 106 is made of a glass. In irradiating the substrate with laser light, the substrate is fixed on a substrate fixing stage 107 by sucking means or mechanically-fixing means so as not to drop. In addition, the substrate fixing stage 107 can be moved in X direction or in Y direction on a face parallel to a surface of the semiconductor film using an X stage 108 and a Y stage 109. By the X stage 108 and the Y stage 109, the glass substrate fixed on the substrate fixing stage 107 can be moved at a speed of 100 to 1000 mm/sec. Here, a stage on which a substrate is set is moved in X direction (or Y direction) with respect to the fixed irradiation region of a laser beam so as to scan laser light. It should be noted that an optimum scanning speed which is anticipated based on the experience of the present inventors is around 400 mm/sec.

The scanning method is not limited to the method in which X stage 108 and Y stage 109 are moved, and laser light may be scanned by a galvanometer mirror or a polygon mirror. A laser beam that is formed into a band-like shape along the vertical side direction (Y direction) of the substrate is delivered and the irradiation region is moved relatively to the substrate so as to scan laser light in the horizontal direction (X direction).

Figure 3:
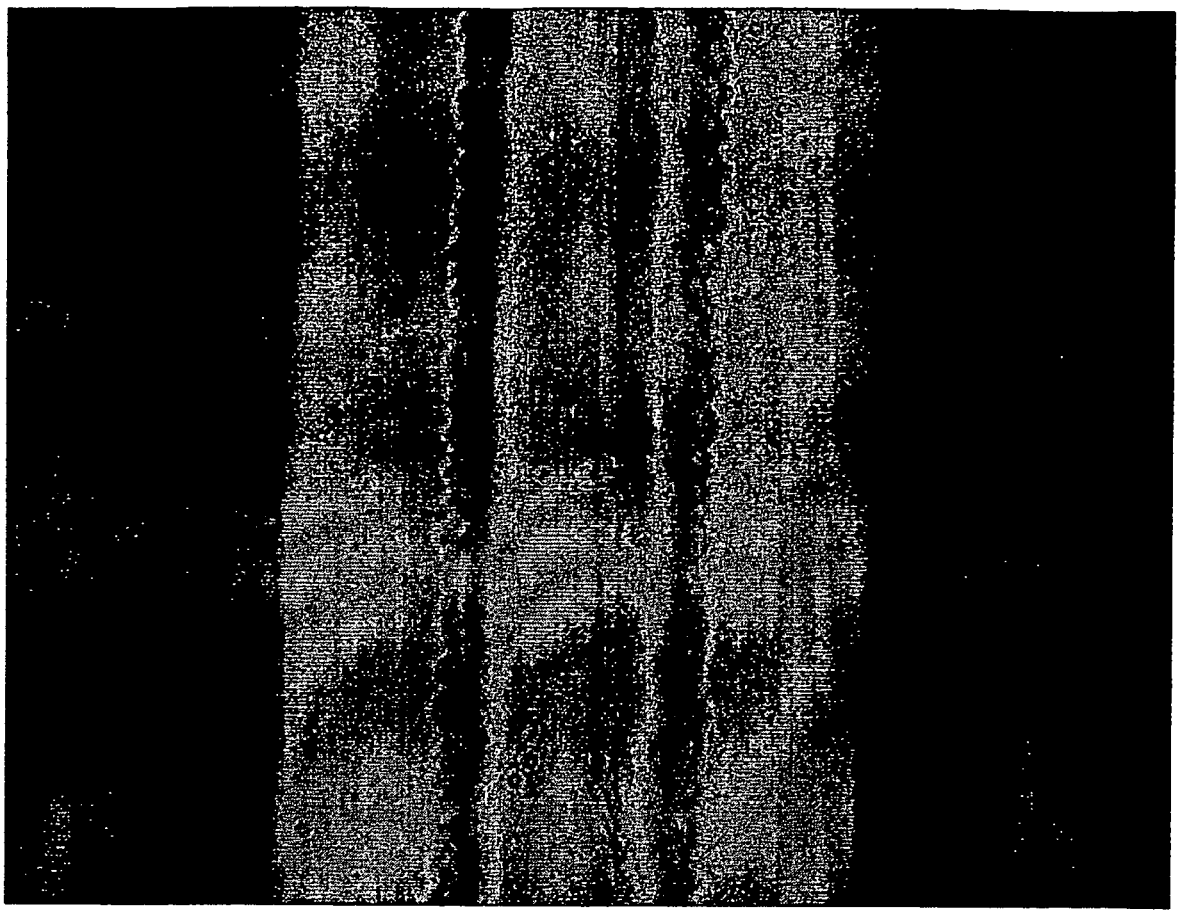
FIG. 3 is an optical microscope photograph.
Figure 4:
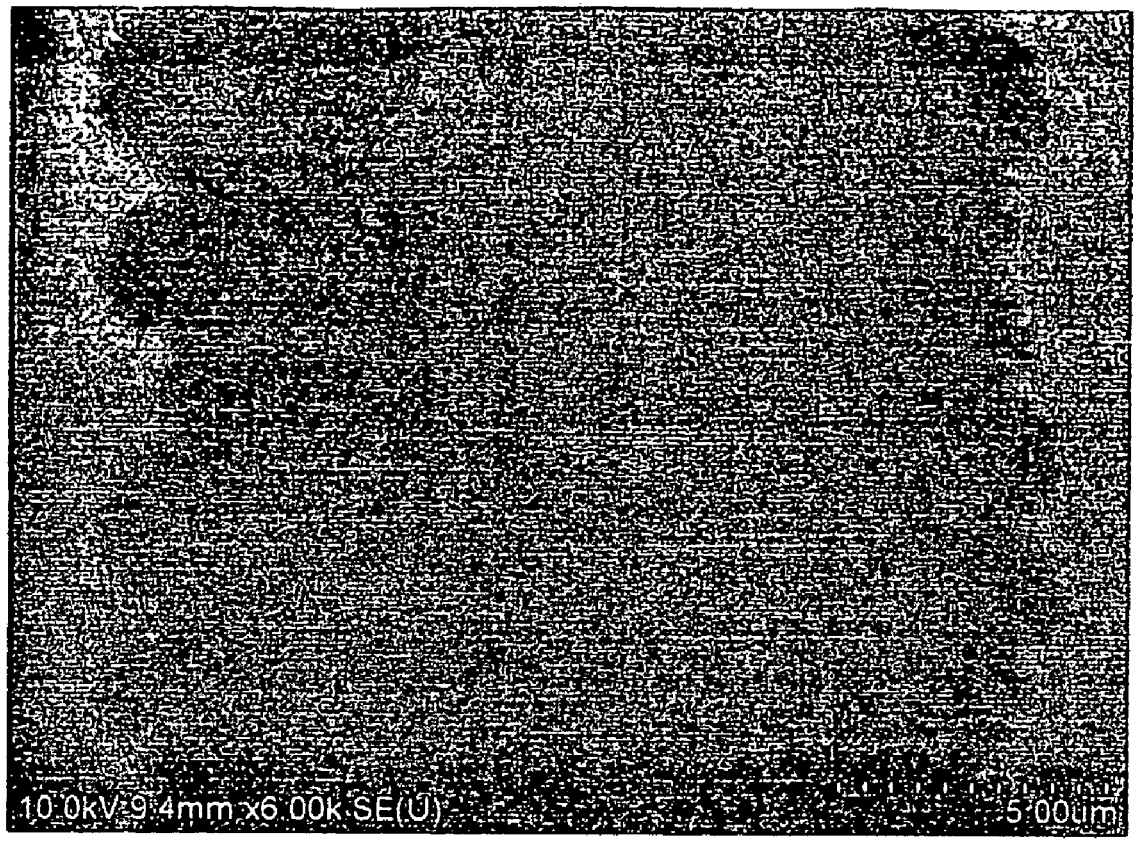
FIG. 4 is a SEM photograph.

Actually, an amorphous silicon film formed on a glass substrate was irradiated with a laser beam by a laser annealing method of the present invention (laser medium: Ti:sapphire, output power of 1.3 W, wavelength of 800 nm, pulse width of 150 femtosecond, and repetition rate of 90 MHz), and at this time, crystallization could be conducted. The beam spot was 8 μm×40 μm and the scanning speed of the stage was 100 mm/sec. An optical microscope photograph (magnification 1,000 times) of the surface of a semiconductor film obtained at this time is shown in FIG. 3. In addition, a SEM photograph of the surface of the semiconductor film obtained at this time is shown in FIG. 4. By the experiment, it can be confirmed that large grain crystals by crystallization according to the present invention can be formed.

The photograph shown in FIG. 3 is a photograph of a surface of a semiconductor film in which only a region irradiated with laser light by scanning in one direction is crystallized so as to distinguish the irradiation region from a non-irradiation region. In FIG. 3, scanning is partially conducted; however, it is natural that scanning is conducted at an appropriate speed to obtain large grain crystals on the whole surface of the substrate.

By the present invention, a semiconductor element such as a TFT is formed appropriately using a semiconductor film in which such large grain crystals are formed, and thus, it can be applied for a development of a high performance device.

Embodiment Mode 1 represents the example where the laser beam is delivered to the amorphous semiconductor film (amorphous silicon film) to be crystallized so as to obtain a semiconductor film having a crystalline structure (hereinafter, also referred to as a crystalline semiconductor film). However, the embodiment is not especially limited to the crystallization purpose but can be applied to a variety of laser annealing treatments typified by an activation treatment or a treatment for forming a silicide.

The present invention may be applied to laser irradiation for enhancing crystallinity and repairing defects remaining in crystal grains, for a crystalline semiconductor film that is crystallized by a solid phase epitaxy method or a method of adding a metal element for promoting crystallization such as Ni and heating it (Japanese Patent Laid-Open No. H7-130652 or Japanese Patent Laid-Open No. H8-78329).

EMBODIMENT MODE 2

A manufacturing process of a top gate TFT according to the present invention is shown briefly with reference to FIGS. 5A to 5E. Laser light that has a repetition rate of 10 MHz or more and that is a fundamental wave is delivered to a semiconductor film having an amorphous structure (hereinafter, also referred to as an amorphous semiconductor film) and a non linear optical effect (multiphoton absorption) is caused to conduct crystallization.

Figure 5A:
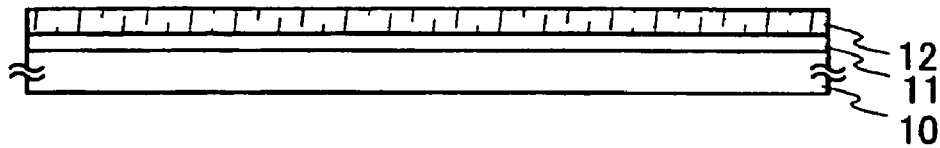
FIGS. 5A to 5E are cross-sectional views showing a manufacturing process of a top gate TFT.

As shown in FIG. 5A, a base insulating film 11 serving as a blocking layer and an amorphous semiconductor film 12 are formed over a substrate 10 having an insulating surface.

A glass substrate such as a barium borosilicate glass or an alumino borosilicate glass is used for the substrate 10 having an insulating surface. In addition, a plastic substrate that can endure a processing temperature in this process, for example, a plastic substrate obtained by processing, into a sheet-like form, a material in which inorganic particles with a diameter of several nm are dispersed in an organic polymer matrix may be used.

As the base insulating film 11 formed over the substrate 10 having an insulating surface, an insulating film such as a silicon oxide film, a silicon nitride film or a silicon oxynitride film ($SiO_xN_y$) is used. As a typical example of the base insulating film 11, a two-layer structure in which a silicon nitride oxide film of 50 to 100 nm thick that is formed using $SiH_4$, $NH_3$ and $N_2O$ as a reactive gas and a silicon oxynitride film of 100 to 150 nm thick that is formed using $SiH_4$ and $N_2O$ as a reactive gas are stacked, can be employed. In addition, a silicon nitride film (SiN film) or a silicon oxynitride film ($SiN_xO_y$ film, x>y) that is 10 nm or less thick is preferably used as one layer of the base insulating film 11. Alternatively, a three-layer structure in which a silicon nitride oxide film, a silicon oxynitride film and a silicon nitride film are continuously stacked may be employed.

A semiconductor material mainly containing silicon is used as the amorphous semiconductor film 12. Typically, an amorphous silicon film or an amorphous silicon germanium film is formed by a known method (such as sputtering, LPCVD or plasma CVD).

Instead of the amorphous semiconductor film 12, a crystalline semiconductor film that is formed without being subjected to crystallization separately (such as a polycrystal silicon film, a microcrystal semiconductor film or a semiamorphous semiconductor film) may be used.

Figure 5B:
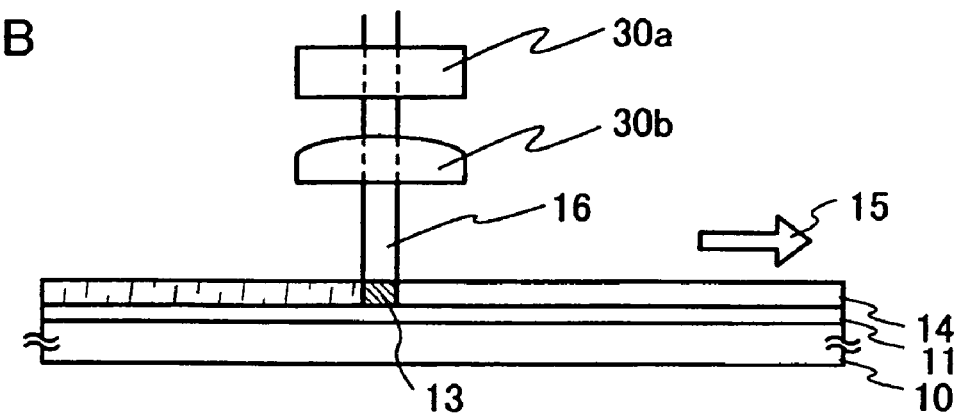

Thereafter, the laser irradiation apparatus shown in FIG. 1 is used to irradiate the amorphous semiconductor film 12 with laser light that has a repetition rate of 10 MHz or more and that is a fundamental wave. A non linear optical element is not incorporated in a laser oscillator of the laser irradiation apparatus shown in FIG. 1 and the laser oscillator can emit laser light of a fundamental wave with a high output power. FIG. 5B is a cross sectional view of a process in which the amorphous semiconductor film 12 is irradiated with laser light. In FIG. 5B, laser light 16 is converged by optical systems 30a and 30b to form an irradiation region 13, and at the same time, a stage on which a substrate is fixed is moved in a direction shown by the arrow 15 to crystallize the whole substrate.

By the laser irradiation method shown in Embodiment Mode 1, even when laser light that is a fundamental wave with high intensity is emitted to generate multiphoton absorption, the laser light is absorbed by the amorphous semiconductor film 12, thereby forming a crystalline semiconductor film 14. By the laser irradiation method described in Embodiment Mode 1, laser irradiation that hardly generates a poorly crystalline region can be conducted. Therefore, a region that cannot be used as a channel forming region of a TFT can be reduced drastically; therefore, yield can be increased and cost reduction can be easily achieved.

When a crystalline semiconductor film that is formed without being subjected to crystallization separately is used instead of the amorphous semiconductor film 12, a crystal having a grain diameter larger than a crystal after film formation can be obtained by irradiation of laser light with a fundamental wave.

In any case, when laser irradiation is conducted, a thin oxide film is formed on a surface of the crystalline semiconductor film 14. The thin oxide film on the surface is preferably removed because the thickness or the evenness thereof is uncertain. A watermark is easily generated due to drying on a water repellent surface. After removing the oxide film, it is preferable to prevent watermark by forming an oxide film with a water solution containing ozone. In addition, in order to reduce the number of processes, an oxide film formed on a surface by laser irradiation is not necessarily removed.

Figure 5C:
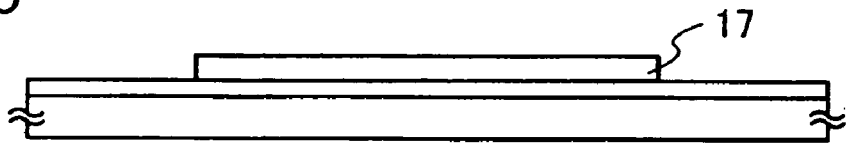

Then, selective etching is conducted by a photolithography technique to obtain a semiconductor layer 17 (FIG. 5C). Before forming a resist mask, an oxide film is formed with a water solution containing ozone or ozone generated by UV irradiation in an oxygen atmosphere so as to protect the semiconductor layer. The oxide film here also has an effect of improving wettability of resist.

If necessary, before selective etching using resist is conducted, doping of a slight amount of an impurity element (such as boron or phosphorus) is conducted through the oxide film to control a threshold voltage of a TFT. In the case of doping through the oxide film, the oxide film is removed and another oxide film is formed with a water solution containing ozone.

Figure 5D:
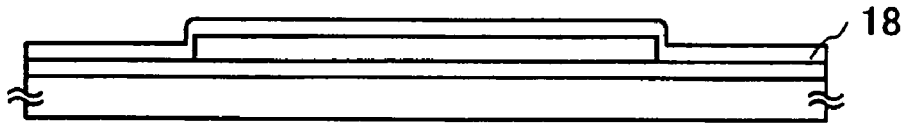

Then, after cleaning for removing unnecessary materials (such as residue of resist or resist peeling solution) made in the selective etching using resist is conducted, an insulating film containing silicon oxide as a main component is formed to cover the surface of the semiconductor layer 17 as a gate insulating film 18 (FIG. 5D).

Thereafter, a gate electrode 19 is formed after washing the surface of the gate insulating film 18. A material including a high melting point metal in which few hillocks are generated is preferably used as a material of the gate electrode 19. One kind selected from W, Mo, Ti, Ta, Co, and the like or an alloy thereof is used as the high melting point metal in which fewer hillocks are generated. Two or more layers of nitrides of the high melting point metal (such as WN, MoN, TiN, and TaN) may be stacked.

Then, the semiconductor film is doped appropriately with an impurity element (for example, P or As) that gives n-type conductivity to a semiconductor, phosphorus here, to form a source region 20 and a drain region 21. After the doping, a heat treatment, intense light irradiation, or laser irradiation is performed in order to activate the impurity element. In addition, as well as activation, plasma damage to the gate insulating film and plasma damage to the interface between the gate insulating film and the semiconductor layer can be recovered.

The laser irradiation apparatus shown in FIG. 1 may be used to conduct laser irradiation by the laser irradiation method described in Embodiment Mode 1 so as to activate the impurity element. When the laser irradiation apparatus shown in FIG. 1 is used, activation of the impurity element that is added to the semiconductor film can be conducted uniformly.

Figure 5E:
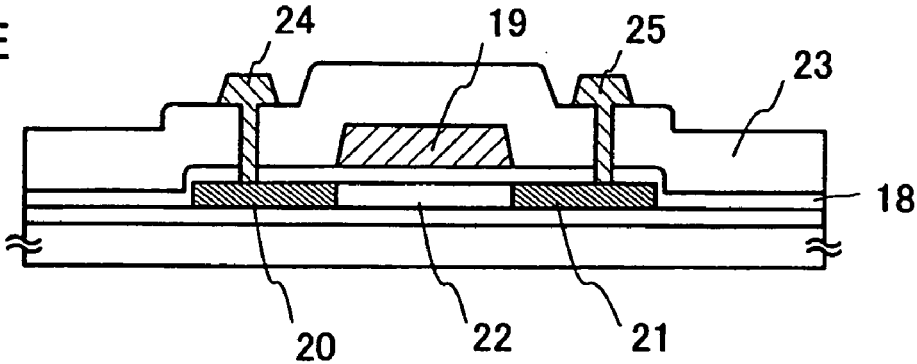

By subsequent steps of forming an interlayer insulating film 23, performing hydrogenation, forming contact holes reaching the source region 20 and the drain region 21, forming a conductive film, and forming a source electrode 24 and a drain electrode 25 by selectively etching the conductive film with a resist, a TFT (n-channel TFT) is completed (FIG. 5E). The source electrode 24 and the drain electrode 25 are formed by using a single layer including an element selected from the group consisting of Mo, Ta, W, Ti, Al, and Cu, or an alloy material or a compound material containing the element as its main component, or by using a stacked layer of these. For example, a three layer structure of a Ti film, a pure-Al film, and a Ti film, or a three layer structure of a Ti film, an Al alloy film containing Ni and C, and a Ti film is used. Further, in consideration of forming an interlayer insulating film and the like in subsequent steps, it is preferable that the cross section of the electrode has a tapered shape.

Here, a top gate TFT is described as an example; however, the present invention can be applied regardless of a TFT structure. For example, the present invention can be applied to a bottom gate (inversely staggered type) TFT or a staggered type TFT.

Further, the present invention is not limited to the TFT structure in FIG. 5E. If necessary, a lightly doped drain (LDD) structure that has an LDD region between a channel forming region and a drain region (or a source region) may be employed. In this structure, a region doped with an impurity element at a lower concentration is provided between a channel forming region and a source region or a drain region formed by doping with an impurity element at a higher concentration, and this region is referred to as an LDD region. Further, a so-called GOLD (Gate-drain Overlapped LDD) structure, in which an LDD region is overlapped with a gate electrode with a gate insulating film interposed therebetween, may be employed.

Figure 6A:
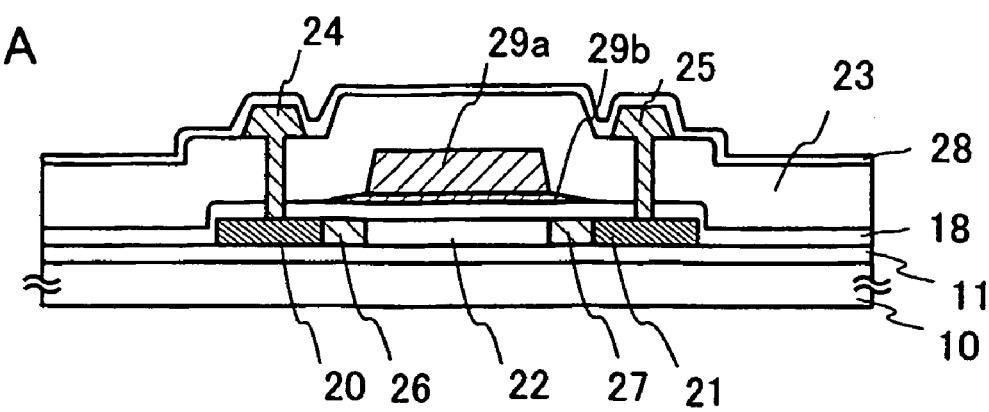
FIGS. 6A and 6B are cross-sectional views showing one example of GOLD structure TFT.
Figure 6B:
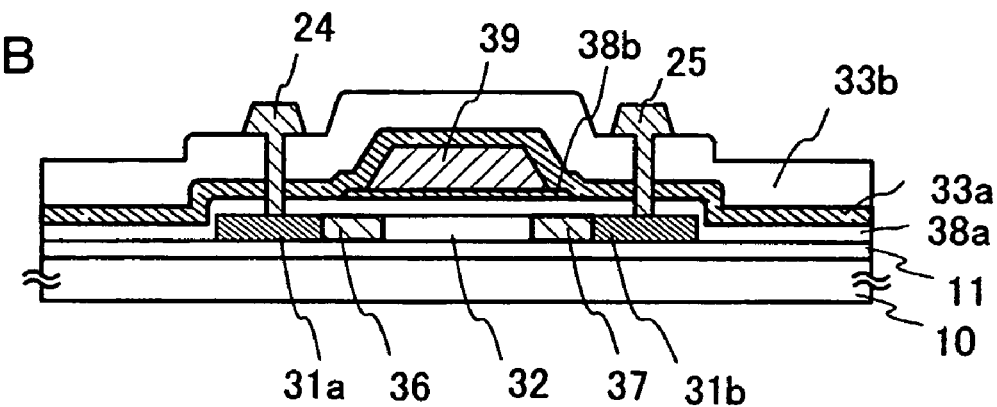

In addition, a TFT having a GOLD structure is described as an example with reference to FIGS. 6A and 6B. A part of a gate electrode structure or the like in the TFT having a GOLD structure shown in FIG. 6A is different from that in FIG. 5E, and thus, the same reference numerals are used for the same portions as those in FIG. 5E. The TFT having a GOLD structure shown in FIG. 6A includes a first LDD region 26 formed between a channel forming region 22 and a source region 20, and a second LDD region 27 formed between the channel forming region 22 and a drain region 21. The first and second LDD regions 26 and 27 are arranged to be overlapped with a lower layer 29$b$ of the gate electrode with a gate insulating film 18 therebetween. The gate electrode is formed to have an upper layer 29$a$ and the lower layer 29$b$ that has a width wider than that of the upper layer 29$a$. In the TFT having a GOLD structure shown in FIG. 6A, a protective film 28 formed with a silicon nitride film is formed. As the protective film 28, a dense inorganic insulating film (such as a SiN film or a SiNO film) formed by PCVD, a dense inorganic insulating film (such as a SiN film or a SiNO film) formed by sputtering, a thin film mainly containing carbon (such as a DLC film, a CN film or an amorphous carbon film), a metal oxide film (such as $WO_2$, $CaF_2$, $Al_2O_3$ or $AlN_xO_y$), and the like are preferably used.

The TFT having a GOLD structure shown in FIG. 6B includes a first LDD region 36 formed between a channel forming region 32 and a source region 31$a$, and a second LDD region 37 formed between the channel forming region 32 and a drain region 31b. The first and second LDD regions 36 and 37 are partially overlapped with the gate electrode in FIG. 6B, while the first and second LDD regions are fully overlapped with the gate electrode in FIG. 6A. In the TFT shown in FIG. 6B, the gate insulating layer has a two-layer structure in which a first gate insulating film 38a made with a silicon oxide film and a second gate insulating layer 38b made with a silicon nitride film are stacked. The gate insulating film can be made thinner by using the second gate insulating film 38b made of a silicon nitride film.

In addition, in the TFT shown in FIG. 6B, a first interlayer insulating film 33a is formed with a silicon nitride film, and the second gate insulating film 38b and the first interlayer insulating film 33a of silicon nitride are provided to surround a single layer of the gate electrode 39. When the gate electrode 39 is formed with a conductive material such as Mo, which is easily oxidized, it is effective to surround the gate electrode with a silicon nitride film so as not to be in contact with the oxide film. By adopting a silicon nitride film for the first interlayer insulating film 33a, it can function as a protective film and can enhance adhesiveness with the second gate insulating film 38b made of the same material.

In the TFT shown in FIG. 6B, the second interlayer insulating film 33b is formed with a silicon oxide film and a source electrode 24 and a drain electrode 25 are formed over the second interlayer insulating film 33b. In addition, the TFT in FIG. 6B has a partially different structure from that in FIG. 5E, and thus, the same reference numerals are used for the same portions as those in FIG. 5E.

An n-channel TFT is shown in FIGS. 5A to 5E and FIGS. 6A and 6B. However, it is natural that a p-channel TFT can be formed using a p-type impurity element instead of an n-type impurity element.

The present invention is not limited to a single gate TFT, and may be applied to a multigate TFT having plural channel forming regions, for example, a double gate TFT, so as to reduce variations in OFF current value of a TFT.

An n-channel TFT and a p-channel TFT can be formed over the same substrate, and a CMOS circuit can be formed by combining an n-channel TFT and a p-channel TFT. The CMOS circuit is a circuit including at least one n-channel TFT and at least one p-channel TFT, for example, an inverter circuit, a NAND circuit, an AND circuit, a NOR circuit, an OR circuit, a shift register circuit, a sampling circuit, a D/A converter circuit, an A/D converter circuit, a latch circuit, a buffer circuit and the like. In addition, a memory element such as SRAM or DRAM and other elements can be provided over the substrate by combining such CMOS circuits. Further, a CPU can be formed over a substrate by integrating various elements or circuits.

This embodiment mode can be freely combined with Embodiment Mode 1.

EMBODIMENT MODE 3

A dual gate TFT to which the present invention is applied is described below as an example with reference to FIG. 7.

Figure 7:
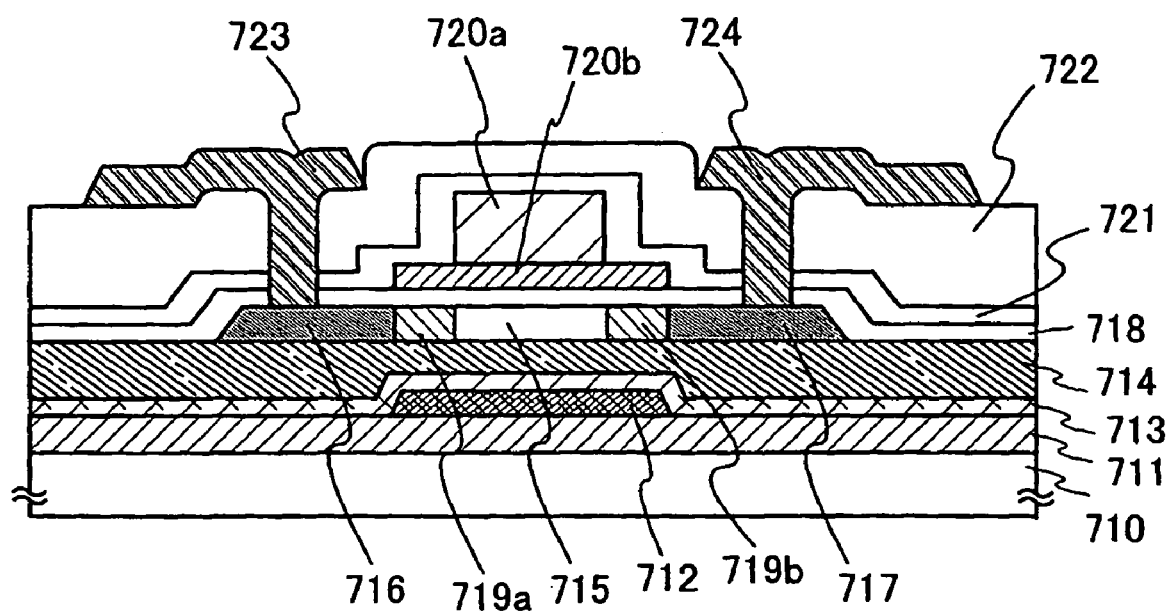
FIG. 7 is a cross-sectional view showing one example of a dual gate structure TFT.

In a TFT shown in FIG. 7, a base insulating film 711 is formed over a substrate 710 having an insulating surface and a lower electrode 712 is formed over the base insulating film 711.

The lower electrode 712 can be formed with a metal or a polycrystal semiconductor doped with one conductivity type impurity element. If a metal is used, tungsten (W), molybdenum (Mo), titanium (Ti), tantalum (Ta), aluminum (Al) and the like can be used. Here, tungsten is used for the lower electrode 712 and the tungsten layer is formed with a thickness of 50 nm. It should be noted that the thickness of the lower electrode 712 may be 20 to 50 nm.

After that, the lower electrode 712 is formed by etching the tungsten layer with the use of a mask (for example, a resist mask). For example, at this time, the resist mask can be narrowed by applying oxygen plasma. When the etching is conducted after such a process, the side of the lower electrode 712 to become the gate electrode can be tapered.

The lower electrode 712 can be directly formed by a printing method or a droplet-discharge method typified by an ink-jet method, which can each discharge a material to the predetermined location. With this method, the lower electrode 712 can be formed without using the mask.

In addition, the lower electrode 712 is covered with a first insulating film 713 and a second insulating film 714 that are to be a first gate insulating film. The first insulating film 713 contains at least oxygen or nitrogen. In this embodiment mode, a silicon nitride oxide film $(SiN_xO_y)$ (x>y) is formed with a thickness of 50 nm as the first insulating film 713 and a silicon oxynitride film $(SiO_xN_y)$ (x>y) is formed with a thickness of 100 nm as the second insulating film 714. However, the present invention is not limited to these.

A semiconductor layer overlapped with the lower electrode 712 is formed over the second insulating film 714 with the first insulating film therebetween. The semiconductor layer is obtained by forming a semiconductor film by a method such as a low pressure thermal CVD method, a plasma CVD method or a sputtering method, and then crystallizing it by the laser irradiation method shown in Embodiment Mode 1. After that, etching is selectively conducted using a mask. The laser irradiation method using multiphoton absorption effect described in Embodiment Mode 1 can realize laser irradiation that hardly generates a poorly crystalline region. Therefore, a region that cannot be used as a channel forming region of a TFT is reduced drastically; therefore, yield can be increased and cost reduction can be easily achieved.

The semiconductor layer is covered with a second gate insulating film 718 that is an insulating film containing at least oxygen or nitrogen. The second gate insulating film 718 is formed without conducting laser irradiation for crystallization and the semiconductor layer is pressed physically with the second gate insulating film 718 and laser irradiation may be conducted using the laser irradiation apparatus shown in FIG. 1. In that case, peeling of the semiconductor film due to laser irradiation can be prevented by the second gate insulating film 718.

A lower layer 720b of an upper electrode and an upper layer 720a of the upper electrode are formed over the second gate insulating film 718. The lower layer 720b of the upper electrode has a width wider than that of the upper layer 720a of the upper electrode. The lower layer 720b and upper layer 720a of the upper electrode may both be formed with a conductive material.

In addition, the semiconductor layer includes at least a source region 716 doped with an impurity element at a high concentration, a channel forming region 715, and a drain region 717 doped with an impurity element at a high concentration. Here, in a state that the upper layer 720a and the lower layer 720b of the upper electrode are provided, an impurity element is added through the lower layer 720b of the upper electrode. Thus, a first low concentration impurity region (a first LDD region) 719a that is overlapped with the lower layer 720b of the upper electrode is formed between the source region 716 and the channel forming region 715. In addition, a second low concentration impurity region (a second LDD region) 719b that is overlapped with the lower layer 720b of the upper electrode is formed between the drain region 717 and the channel forming region 715.

An insulating film 721 covering the lower layer 720b and the upper layer 720a of the upper electrode is formed and an insulating film 722 for enhancing planarity is formed over the insulating film 721. As the insulating film 722 for enhancing planarity, an organic material or an inorganic material can be used. As the organic material, resist, polyimide, acryl, polyamide, polyimide amide, benzocyclobutene, siloxane, or polysilazane can be used. Siloxane is an insulating material, for example, an inorganic siloxane insulating material which has a Si—O—Si bond among compounds formed from silicon, oxygen and hydrogen, or an organic siloxane insulating material in which hydrogen bonded with silicon is substituted by an organic group such as methyl or phenyl. In addition, polysilazane is a substance formed from a liquid material containing a polymer material having a bond of silicon (Si) and nitrogen (N) i.e., polysilazane. As an inorganic material, an insulating film having at least oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y) can be used. In addition, as the insulating film 722 for enhancing planarity, a stacked layer of these insulating films may be used. Specifically, when the insulating film for enhancing planarity is formed with an organic material, water or oxygen is absorbed by the organic material, although the planarity is increased. In order to prevent this, an insulating film including an inorganic material may be formed over the organic material. When an insulating film including nitrogen is used as the inorganic material, intrusion of alkali ions such as Na can be prevented.

Over the insulating film 722 for enhancing planarity, a source wiring 723 is formed through a contact hole that reaches the source region 716. Similarly, over the insulating film 722 for enhancing planarity, a drain wiring 724 is formed through a contact hole that reaches the drain region 717.

A TFT having a structure shown in FIG. 7 is a dual gate TFT in which channels are formed in upper and lower parts of one semiconductor layer. The lower electrode 712 of the dual gate TFT has a characteristic of controlling a TFT in a different way from the upper electrode. The lower electrode 712 can suppress variation of a threshold value and reduce an OFF current. In addition, in the dual gate TFT, a capacitor can be formed with the lower electrode and the semiconductor layer with an insulating film therebetween.

This embodiment mode can be freely combined with Embodiment Mode 1 or Embodiment Mode 2.

EMBODIMENT MODE 4

Figure 8:
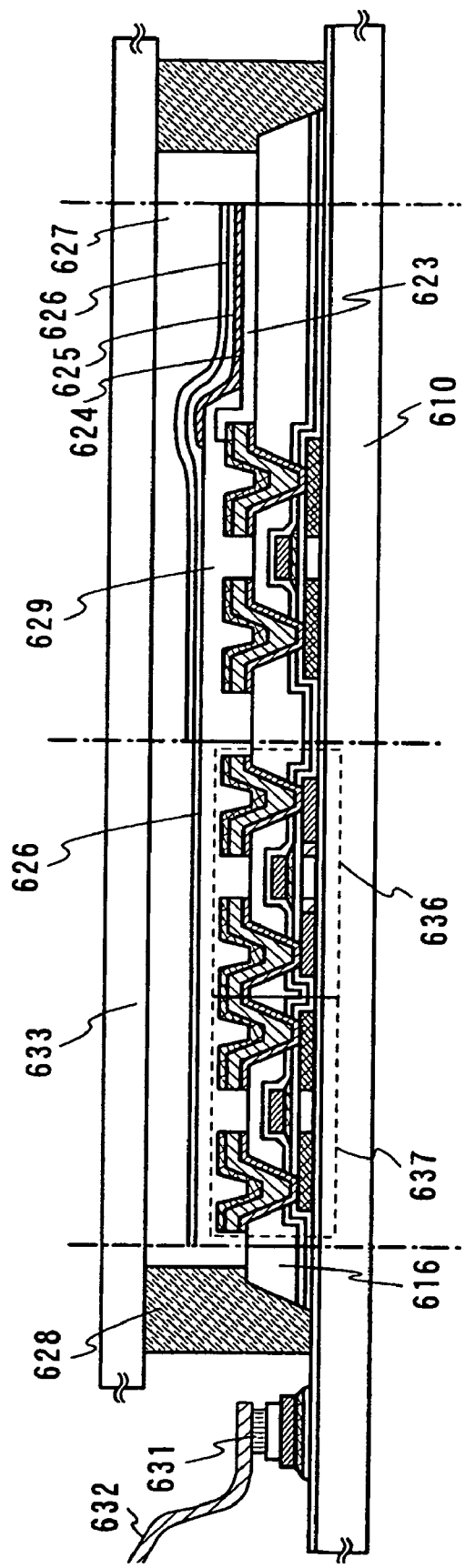
FIG. 8 shows one example of a cross-sectional view of a display device.

The present invention can be applied to a manufacturing method of a liquid crystal display device or a light-emitting display device. Here, a display device in which a pixel portion, a driver circuit and a terminal portion are formed on the same substrate is shown as one example. By the present invention, a semiconductor thin film that can respond to high speed driving can be obtained and a driver circuit can be formed using a higher-performance TFT. FIG. 8 shows an example of a light emitting device having an organic light emitting element as a display device.

After a base insulating film is formed over a substrate 610, each semiconductor layer is formed. Crystallization of the semiconductor layer is conducted following Embodiment Mode 1 or Embodiment Mode 2. By conducting crystallization in accordance with Embodiment Mode 1, laser irradiation that hardly generates a poorly crystalline region can be conducted and a semiconductor layer of a TFT that constitutes a part of a driver circuit can be formed with a semiconductor film having large grain crystals can be formed. Therefore, a driver circuit that can operate at high speed can be realized.

Then, after a gate insulating film covering the semiconductor layer is formed, a gate electrode and a terminal electrode are each formed. Subsequently, a source region and a drain region, and an LDD region if necessary, are appropriately formed by doping the semiconductor with an impurity element which imparts n-type conductivity (typically, phosphorus or arsenic) to form an n-channel TFT 636 and by doping the semiconductor with an impurity element which imparts p-type conductivity (typically, boron) to form a p-channel TFT 637. Subsequently, the impurity element added to the semiconductor layer is activated and hydrogenated after forming a silicon nitride oxide film (SiNO film) which contains hydrogen and which is obtained by PCVD.

Subsequently, a planarizing insulating film 616 which serves as an interlayer insulating film is formed. As the planarizing insulating film 616, an insulating film in which a skeletal including a bond of silicon (Si) and oxygen (O) obtained by a coating method is used.

Next, the planarizing insulating film in a peripheral portion is removed at the same time as forming a contact hole in the planarizing insulating film using a mask.

Next, etching is conducted using the planarizing insulating film 616 as a mask to remove selectively an exposed part of the SiNO film containing hydrogen or the gate insulating film.

After forming a conductive film, etching is conducted using the mask, thereby forming a drain wiring and a source wiring.

Next, a first electrode 623, that is, an anode (or a cathode) of the organic light-emitting element is formed. The first electrode 623 is preferably formed of a conductive film having a high work function, for example, a film including a transparent conductive material such as ITO containing Si (ITSO) and indium zinc oxide (IZO) which is the mixture of indium oxide and zinc oxide (ZnO) of 2 to 20%, in addition to indium tin oxide (ITO), or a compound film which combines such materials, in addition to indium tin oxide (ITO). Above all, ITSO remains in an amorphous state without being crystallized even when subjected to baking, unlike ITO which would be crystallized. Thus, ITSO is superior in planarity to ITO, and does not easily cause a short circuit with the cathode even when the organic compound-containing layer is thin, which is thus suitable for the anode of the light-emitting element.

Next, an SOG film (for example, a $SiO_x$ film containing an alkyl group) obtained by a coating method is selectively etched, thereby forming an insulator 629 (referred to as a bank, a partition wall, a barrier, an embankment, or the like) covering an end portion of the first electrode 623. The insulator 629 is formed using a material including silicon, an organic material and compound material. In addition, a porous film may be used. When the insulator is formed using a photosensitive or a non photosensitive material such as acrylic or polyimide, the side thereof has a shape in which the curvature radius is changed continuously, and a thin film in the upper layer can be formed without disconnection, which is preferable. As the material of the insulator 629, a photosensitive or a non photosensitive organic material dispersed with black pigment or carbon black may be used, and it may function as a black matrix (BM).

An organic compound-containing layer 624 is formed by an evaporation method, a thermal transfer printing method, a droplet-discharge method or a screen printing method. The organic compound-containing layer 624 has a multilayer structure, for example, a structure in which an electron transporting layer (an electron injecting layer), a light emitting layer, a hole transporting layer, and a hole injecting layer are sequentially stacked.

Here, molybdenum oxide ($MoO_x$), 4,4'-bis[N-(1-naphthyl)-N-phenyl-amino]-biphenyl (α-NPD) and rubrene are co-evaporated by an evaporation method to form a first organic compound containing layer (first layer) over the first electrode 623. Then, α-NPD is selectively deposited with an evaporation mask to form a hole transporting layer (second layer) over the first organic compound containing layer. In addition, instead of molybdenum oxide ($MoO_x$), one or plural kinds selected from $MoN_x$, $VO_x$, $RuO_x$, $CoO_x$, $CuO_x$, $ZnN_x$, $WN_x$, $InO_x$, $InN_x$, $SnO_x$, $SnN_x$, $SbO_x$, and $SbN_x$ can be used.

A light-emitting layer (third layer) is selectively formed. The light-emitting layer is formed with a charge injecting-transporting material including an organic compound or inorganic compound and a luminescent material. The light-emitting layer includes one layer or more layers selected from layers including a low molecular weight organic compound, an intermediate molecular weight organic compound (referring to an organic compound which has no sublimation property and has 20 molecules or less or a chained molecule of 10 μm or less in length), or a high molecular weight organic compound which are classified based on the number of molecules, and may be combined with an electron injecting-transporting or hole injecting-transporting inorganic compound. Further, for the light-emitting layer, a triplet-excitation luminescent material such as metal complexes may be used in addition to a singlet-excitation luminescent material. For example, among a red light-emitting pixel, a green light-emitting pixel, and a blue light-emitting pixel, the red light-emitting pixel, of which luminance is decreased by half in a relatively short time, is formed with the use of a triplet-excitation luminescent material while the others are formed with the use of singlet-excitation luminescent materials. Since triplet-excitation luminescent materials are excellent in luminous efficiency, it is a feature that less power is consumed to obtain the same luminance. In other words, when a triplet-excitation luminescent material is applied to the red pixel, the amount of the current flowing in a light-emitting element is small so that the reliability can be improved. In order to lower power consumption, the red light-emitting pixel and the green light-emitting pixel may be formed with the use of triplet-excitation luminescent materials while the blue light-emitting pixel may be formed with the use of a singlet-excitation luminescent material. Also, as to a green light-emitting element for green emission that people can see at high visibility acuity, the power consumption can be lowered by forming the green light-emitting element with the use of a triplet-excitation luminescent material.

As an example of the triplet excitation luminescent material, there is a material using a metal complex as a dopant, and for example, a metal complex having platinum that is a third transition series element as a central metal and a metal complex having iridium as a central metal, and the like are known. The triplet-excitation luminescent material is not limited to these compounds, and a compound that has the structure described above and that has an element belonging to Groups 8 to 10 of the periodic table as a central metal can also be used.

In order to obtain a full color display device, evaporation masks for each emission color (R, G, B) are aligned to deposit light-emitting layers of each color. Typically, a light-emitting layer corresponding to each emission color R (red), G (green) and B (blue) is formed in each pixel.

Tris(8-quinolinato)aluminum ($Alq_3$) is selectively deposited with a use of an evaporation mask to form an electron transporting layer (fourth layer) over the light-emitting layer. Then, 4,4-bis(5-methylbenzoxazol-2-yl)stilbene (BzOs) and Li are co-evaporated to form an electron injecting layer (fifth layer) over the whole surface to cover the electron transporting layer and the insulator. Materials of the first to fifth layers in the organic compound containing layer 624 are each appropriately selected and the thicknesses thereof are adjusted.

The aforementioned substances for forming the organic compound containing layer 624 are only examples, and a light-emitting element can be formed by appropriately stacking each functional layer such as a hole injecting-transporting layer, a hole-transporting layer, an electron injecting-transporting layer, an electron-transporting layer, a light-emitting layer, an electron-blocking layer, and a hole-blocking layer. In addition, a mixed-layer or mixed-junction structure combining such layers may be employed. The layer structure of the light-emitting layer can be changed. A modification is possible without departing the spirit of the present invention, such that no specific electron-injecting region or light-emitting region is provided but an electrode layer for this purpose is provided or a light-emitting material is dispersed.

A second electrode 625 formed with a transparent conductive film, that is, a cathode (or anode) of an organic light emitting element, is formed over the organic compound containing layer 624. Then, a transparent protective layer 626 is formed by an evaporation method or a sputtering method. The transparent protective layer 626 protects the second electrode 625. The transparent protective layer 626 is preferably formed of a dense inorganic insulating film (e.g., SiN film or SiNO film) obtained by PCVD, a dense inorganic insulating film (e.g., SiN film or SiNO film) obtained by sputtering, a thin film containing carbon as a main component (e.g., DLC film, CN film or amorphous carbon film), a metal oxide film (e.g., $WO_2$, $CaF_2$, $Al_2O_3$ or $AlN_xO_y$) or the like. Note that "transparent" means that the transmissivity of visible light is 80 to 100%.

A transparent sealing substrate 633 is attached by a sealing agent 628 to encapsulate a light-emitting element. In a light emitting display device, a circumference of a display portion is surrounded by the sealing agent and sealed with a pair of substrates. However, the interlayer insulating film of the TFT is provided over the entire surface of the substrate. Therefore, when a pattern of the sealing agent is drawn inside a circumference edge of the interlayer insulating film, there is a possibility that moisture or an impurity may enter from a part of the interlayer insulating film which is located outside the pattern of the sealing agent. Consequently, as for the circumference of the planarizing insulating film used as the interlayer insulating film of the TFT, the sealing agent covers the inside of the pattern of the sealing agent, preferably, the edge portion of the planarizing insulating film to overlap the pattern of the sealing agent. Note that a region surrounded by the sealing agent 628 is filled with a transparent filler 627. As the transparent filler 627, ultraviolet curable resin, a thermosetting resin, a silicone resin, an epoxy resin, an acrylic resin, a polyimide resin, a phenol resin, PVC (polyvinyl chloride), PVB (polyvinyl butyral), EVA (ethylene vinyl acetate) or the like can be used.

Instead of filling the region surrounded by the sealing agent 628 with transparent filler, a dry inert gas may be used. At this time, a drying agent that absorbs moisture by chemical absorption, such as calcium oxide or barium oxide is arranged in a location such that does not hinder displaying.

Lastly, an FPC 632 is attached to the terminal electrode with an anisotropic conductive film 631 by a known method. The terminal electrode is preferably formed by stacking a transparent conductive film over a terminal electrode formed simultaneously with a gate wiring (FIG. 8).

According to the above steps, a pixel portion, a driver circuit, and a terminal portion can be formed over one substrate.

Light generated in the light-emitting element can be extracted to opposite sides, in other words, through the substrate 610 and the sealing substrate 633. The structure in FIG. 8 is a light-emitting device having a structure in which light is extracted through the substrate and the sealing substrate.

Thus, according to the present invention, a polarizing plate, a circularly polarizing plate, or a combination thereof can be provided depending on a structure of a light-emitting device in which light can be extracted through the substrate and the sealing substrate. Therefore, clear black display can be performed and a contrast is improved. Further, the circularly polarizing plate can prevent reflective light.

If a reflective metal material is used for the second electrode 625 instead of a transparent conductive film, a bottom emission type light-emitting element can be manufactured. On the contrary, a top emission type light-emitting device can be manufactured by using a transparent conductive film as the second electrode 625.

In addition, if necessary, other optical films (such as a retardation film, a color filter, or a color conversion filter) or a micro lens array, may be arranged as well as a polarizing plate or a circularly polarizing plate. For example, a color filter is provided on the side of a light-emitting element of the sealing substrate overlapping the display region, or an observer side so as to enhance color purity of each emission from the light-emitting elements of RGB provided in the display portion. In addition, a light-emitting element for white may be provided in the display portion and a color filter or a color filter and color conversion layer may be provided separately to display full color.

In the light emitting device, a method of driving screen display is not especially limited. For example, a dot sequential driving method, a line sequential driving method, a frame sequential driving method, and the like may be used. A line sequential driving method is typically used, and a time division gray scale driving method or a frame area gray scale driving method may also be appropriately employed. Further, video signals input to a source line of the light emitting device may be either analog signals or digital signals. A driver circuit and the like may be properly designed according to the video signals.

Further, light-emitting devices using digital video signals are classified into one in which video signals are inputted into a pixel at a constant voltage (CV), and one in which video signals are inputted into a pixel at a constant current (CC). The light-emitting devices in which video signals are inputted into a pixel at a constant voltage (CV) are further classified into one in which a constant voltage is applied to a light-emitting element (CVCV), and one in which a constant current is applied to a light-emitting element (CVCC). The light-emitting devices in which video signals are inputted into a pixel at a constant current (CC) is classified into one in which a constant voltage is applied to a light-emitting element (CCCV), and one in which a constant current is applied to a light-emitting element (CCCC).

In the light emitting device, a protection circuit (such as a protection diode) may be provided for the purpose of inhibiting electrostatic discharge damage.

An example of mounting an FPC or a driver IC for driving to a light-emitting display panel manufactured according to the above described method is described.

Figure 9A:
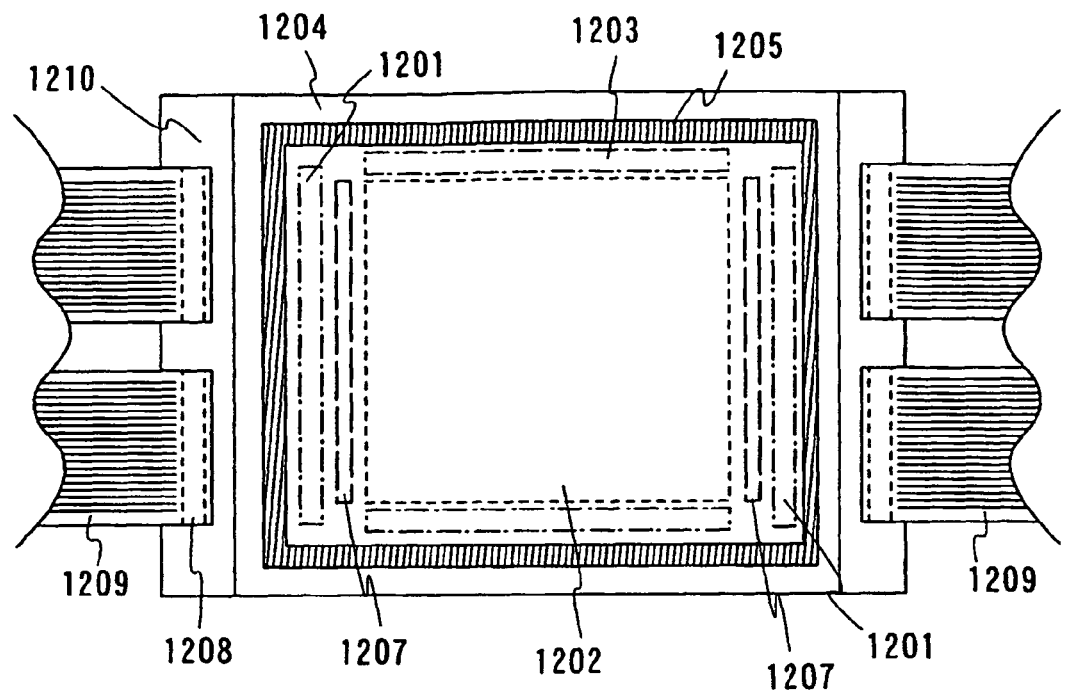
FIGS. 9A and 9B each show a top view of a display device.

FIG. 9A is a top view of a light-emitting device in which FPCs 1209 are attached to four terminal portions 1208 as an example. A pixel portion 1202 including a light-emitting element and a TFT, a gate-side driver circuit 1203 including a TFT,land a source-side driver circuit 1201 including a TFT are formed over a substrate 1210. These circuits can be formed over one substrate when active layers of TFTs each are formed from a crystalline semiconductor film. Therefore, an EL display panel in which the system-on-panel is realized can be manufactured.

Note that the substrate 1210 is covered with a protective film except a contact portion, and a base layer containing a photocatalytic substance is provided over the protective film.

Two connecting regions 1207 provided so as to sandwich the pixel portion are provided for contacting a second electrode of the light-emitting element to a lower wiring. Note that a first electrode of the light-emitting element is electrically connected to a TFT provided in the pixel portion.

A sealing substrate 1204 is fixed to the substrate 1210 by a sealing agent 1205 surrounding the pixel portion and the driver circuits and by a filler surrounded by the sealing agent. In addition, a filler including a transparent drying agent may be used to fill a space. The drying agent may be disposed in a region which is not overlapped with the pixel portion.

Figure 9B:
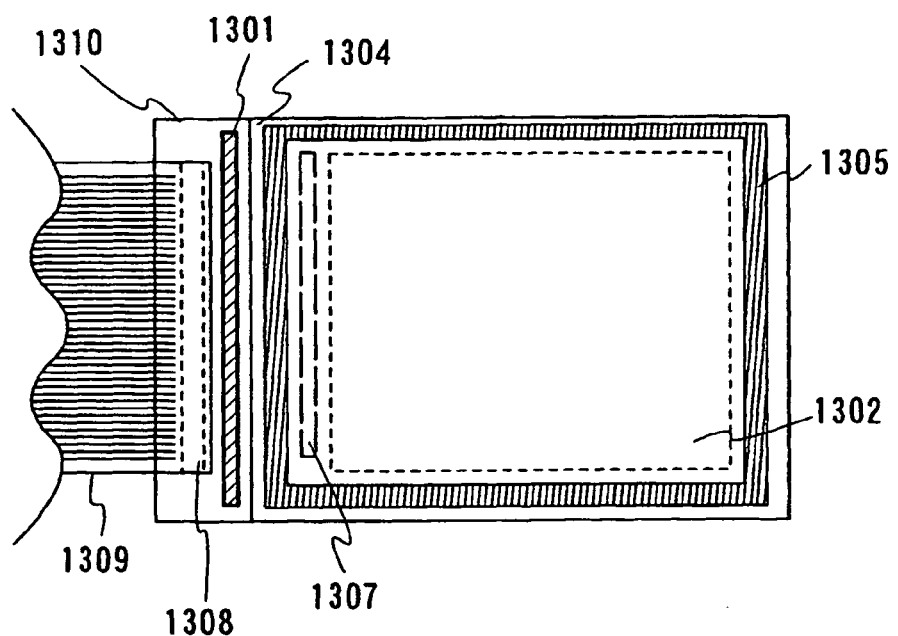

The structure shown in FIG. 9A is a preferred example of a light-emitting device of a relatively large size of XGA class (for example, the opposite angle: 4.3 inches). FIG. 9B is an example of employing a COG mode which is suitable for a small size light-emitting device whose frame is narrowed (for example, the opposite angle: 1.5 inches).

In FIG. 9B, a driver IC 1301 is mounted on a substrate 1310 and an FPC 1309 is mounted on a terminal portion 1308 disposed at the end of the driver IC. A plurality of the driver ICs 1301 to be mounted are preferably formed over a rectangular substrate that is 300 to 1000 mm or more on one side, from a view point of improving the productivity. In other words, a plurality of circuit patterns having a driver circuit portion and an input-output terminal as a unit are preferably formed over a substrate and separated so that driver ICs can be obtained individually. As a semiconductor layer of TFTs used for the driver ICs, a semiconductor layer which is crystallized with the laser irradiation apparatus shown in FIG. 1 is used. Thus, a high-performance driver IC can be obtained. The driver IC may be formed to become a rectangular having a longer side of 15 to 80 mm and a shorter side of 1 to 6 mm in consideration of a length of one side of a pixel portion or a pixel pitch. In addition, the driver IC may be have a longer side corresponding to one side of a pixel portion or a length in which one side of a driving circuit is added to one side of the pixel portion.

The driver IC is superior to an IC chip in terms of an external size, since it has a longer side. When a driver IC formed to be 15 to 80 mm in a longer side is used, the number of driver ICs to be required for being mounted corresponding to the pixel portion is small, as compared with the case of using IC chips, thereby improving the yield in manufacturing. When a driver IC is formed over a glass substrate, the productivity is not lost because there is no limitation on the shape of a mother substrate. This is a great advantage, as compared with the case of forming IC chips using a circular silicon wafer.

In addition, a TAB mode may be employed, and in that case, a plurality of tapes are attached and a driver IC may be mounted on the tapes. As in the case of the COG mode, a single driver IC may be mounted on a single tape. In this case, a metal piece or the like for fixing a driver IC is preferably attached together for enhancing the intensity.

The substrate 1310 is covered with a protective film except a contact portion, and a base layer containing a photocatalytic substance is provided over the protective film.

A connecting region 1307 provided between a pixel portion 1302 and the driving IC 1301 is provided for contacting a second electrode of a light-emitting element to a lower wiring. Note that the first electrode of the light-emitting element is electrically connected to the TFT provided in the pixel portion.

A sealing substrate 1304 is fixed on the substrate 1310 by a sealing agent 1305 surrounding the pixel portion 1302 and by a filler surrounded with the sealing agent.

In the case of using an amorphous semiconductor film as an active layer of a TFT, it is difficult to form a driver circuit over the same substrate, and thus, the structure shown in FIG. 9B is employed even when it has a large size.

The active matrix light emitting display device is shown as an example of a display device here, and it is natural that the present invention can be applied to an active matrix liquid crystal display device. In the active matrix liquid crystal display device, pixel electrodes arranged in matrix are driven to display an image pattern on the screen. Specifically, a voltage is applied to a selected pixel electrode and an opposite electrode corresponding to the pixel electrode, and thus, a liquid crystal between the pixel electrode provided in the element substrate and the opposite electrode provided in the opposite substrate is modulated optically. The optical modulation can be recognized as an image pattern by an observer. The opposite substrate and the element substrate are arranged at an even interval and the space therebetween is filled with a liquid crystal. The substrates may be pasted to each other by dropping the liquid crystal material under reduced pressure so that a bubble does not enter by the sealing agent having a closed pattern. Alternatively, a dip method (pumping method) may be employed in which the liquid crystal is injected using capillary phenomenon after providing a seal pattern having an opening portion and pasting the TFT substrate.

The present invention can be applied to a liquid crystal display device which employs a structure in which an optical shutter is constituted by a polarizing plate and a liquid crystal panel without a color filter, and a driving method of a field sequential system of blinking a backlight light source for three colors of RGB at high speed.

This embodiment mode can be freely combined with Embodiment Mode 1, 2, or 3.

EMBODIMENT MODE 5

Embodiment Mode 5 describes an example of manufacturing a CPU (Central Processing Unit) according to the present invention with reference to FIGS. 10A to 10C, FIGS. 11A to 11C, FIGS. 12A to 12C, FIGS. 13A to 13B, and FIG. 14.

Figure 10A:
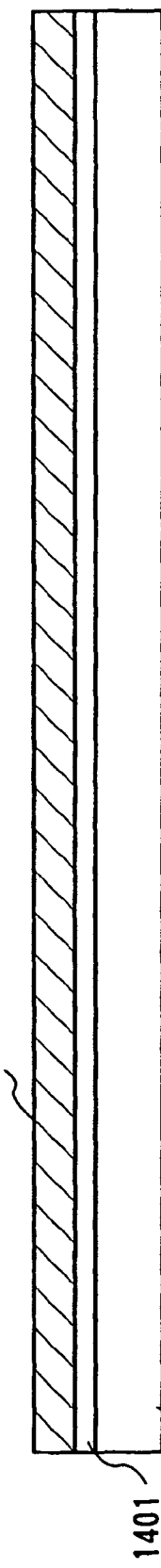
FIGS. 10A to 10C are cross-sectional views showing a manufacturing steps of a CPU.
Figure 10B:
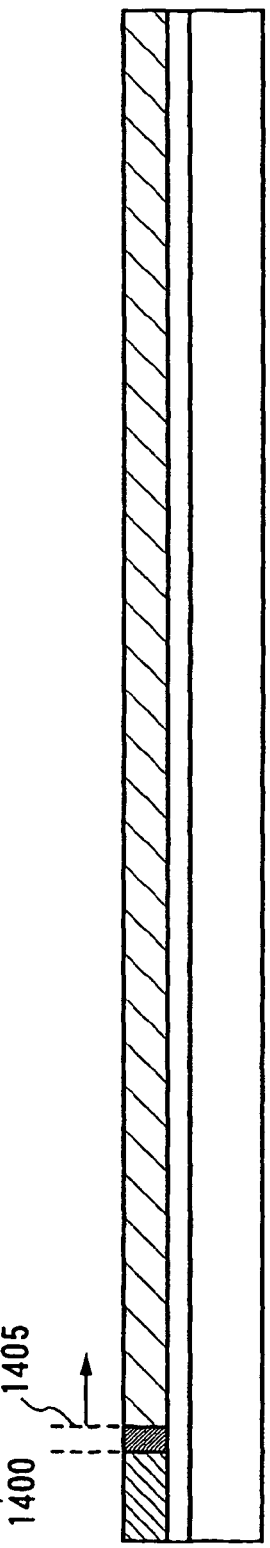

As shown in FIG. 10A, a base insulating film 1401 is formed over a substrate 1400 having an insulating surface. As the substrate 1400, a glass substrate such as barium borosilicate glass or alumino borosilicate glass can be used. Further, a substrate made of synthetic resin having flexibility such as plastic or acrylic typified by PET, PES, or PEN tends to have lower heat resistance than another substrate. Such a substrate can be used, as long as the substrate can resist the treatment temperature in the manufacturing steps.

The base insulating film 1401 is provided to prevent an alkali metal or an alkali-earth metal such as Na included in the substrate 1400 from diffusing into a semiconductor film to adversely affect the characteristic of a semiconductor element. Therefore, the base insulating film 1401 is formed with an insulating film such as silicon oxide, silicon nitride, or silicon oxide containing nitrogen which can suppress the diffusion of an alkali metal or an alkali-earth metal into the semiconductor film.

An amorphous semiconductor film 1402 is formed over the base insulating film 1401. The thickness of the amorphous semiconductor film 1402 is set to 25 to 100 nm (preferably 30 to 60 nm). As the amorphous semiconductor, not only silicon but also silicon germanium can be used. In the case of using silicon germanium, the concentration of germanium is preferably approximately 0.01 to 4.5 atomic %. In this embodiment mode, a 66-nm-thick semiconductor film containing silicon as its main component (also referred to as an amorphous silicon film or amorphous silicon) is used.

After that, the amorphous semiconductor film 1402 is irradiated with a laser light (laser beam) 1405 which is fundamental wave (refer to FIG. 10B) to produce multiphoton absorption as described in Embodiment Mode 1. Note that the pulse width of laser light is set to picosecond or femtosecond so as to produce multiphoton absorption. By this laser irradiation, the amorphous semiconductor film 1402 is crystallized, and a crystalline semiconductor film is formed (Here, poly silicon film).

Figure 10C:
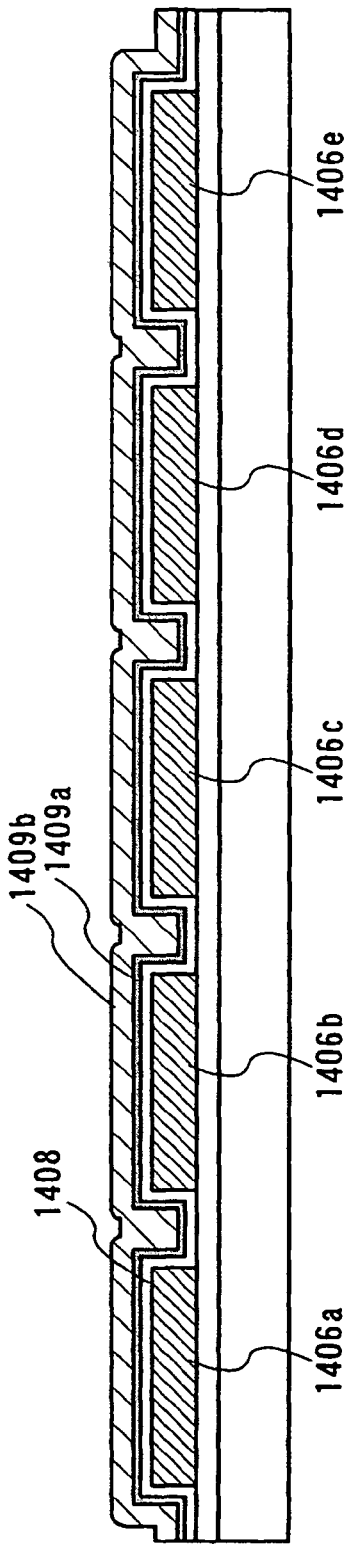

As shown in FIG. 10C, the crystalline semiconductor film is selectively etched into a predetermined shape, thereby obtaining island-shaped semiconductor layers 1406a to 1406e.

After that, a small amount of an impurity element (for example, boron) is added into the crystalline semiconductor film as necessary to make a threshold value, which is the electric characteristic of the thin film transistor, closer to zero.

After that, an insulating film to cover the island-shaped semiconductor layers 1406a to 1406e, which is a so-called gate insulating film 1408, is formed. Before forming the gate insulating film 1408, the surface of the island-shaped semiconductor film is washed with hydrofluoric acid or the like. The gate insulating film 1408 is formed with an insulating film containing silicon with a thickness of 10 to 150 nm, preferably 20 to 40 nm, by a plasma CVD method or a sputtering method. Of course, the gate insulating film is not limited to the silicon oxide film, and another insulating film containing silicon (such as silicon nitride film or silicon oxynitride film) may be formed as a single layer or multilayer structure.

After that, conductive films 1409a and 1409b to serve as a gate electrode are formed over the gate insulating film 1408. Here, the gate electrode is a two layer structure. It is natural that the gate electrode may have a single layer structure or a multilayer structure including three layers or more. The conductive films 1409a and 1409b may be formed with an element selected from Ta, W, Ti, Mo, Al, and Cu, or an alloy material or a compound material containing the above element as its main component.

As shown in FIG. 11A, a resist mask 1410 is formed to etch the first conductive film 1409a and the second conductive film 1409b. Note that an end portion of the resist mask 1410 may have a tapered shape, and the shape of the resist mask may be sector or trapezoidal.

Next, the second conductive film 1409b is selectively etched using the resist mask 1410 as shown in FIG. 11B. Note that the first conductive film 1409a serves as an etching stopper so that the gate insulating film and the semiconductor film are not etched. The etched second conductive film 1409b has a gate length 1413 which ranges from 0.2 to 1.0 μm.

As shown in FIG. 11C, the first conductive film 1409a is etched with the resist mask 1410 provided. At this time, the first conductive film 1409a is etched under a condition where the selective ratio between the gate insulating film 1408 and the first conductive film 1409a is high. With this step, the resist mask 1410 and the second conductive film 1409b may be somewhat etched and be narrower. In this way, the gate electrode, which is extremely small, having a gate length of 1.0 μm or less is formed.

After that, the resist mask 1410 is removed by $O_2$ ashing or resist stripping solution, and a resist mask 1415 for adding an impurity element is appropriately formed. In this manner, the resist mask 1415 is formed to cover a region to become a p-channel TFT.

Figure 12A:
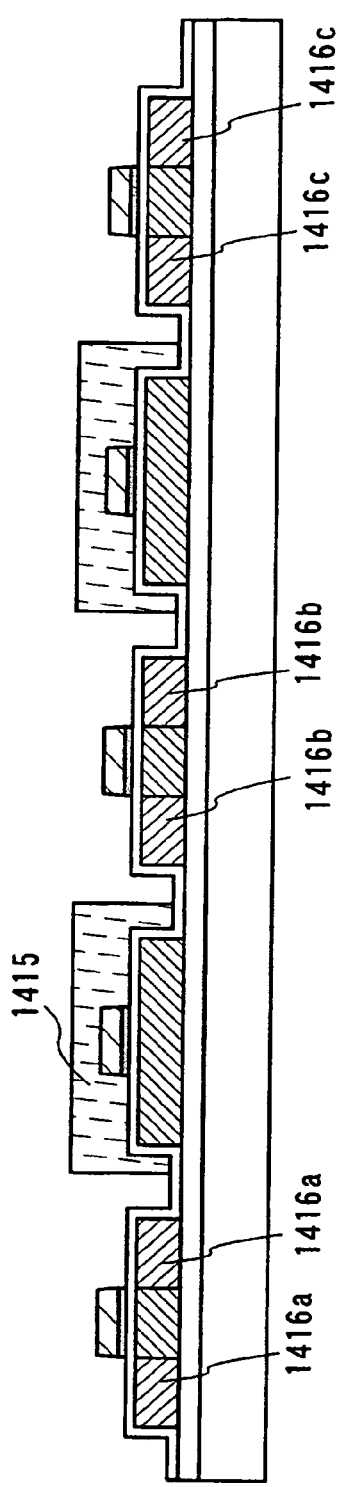
FIGS. 12A to 12C are cross-sectional views showing manufacturing steps of a CPU.

Next, phosphorus (P), which is an impurity element, is added in a self-alignment manner into a region to become an n-channel TFT by using the gate electrode as a mask as shown in FIG. 12A. Here, doping of phosphine ($PH_3$) is conducted at 60 to 80 keV. Then; impurity regions 1416a to 1416c are formed in the region to become an n-channel TFT.

Figure 12B:
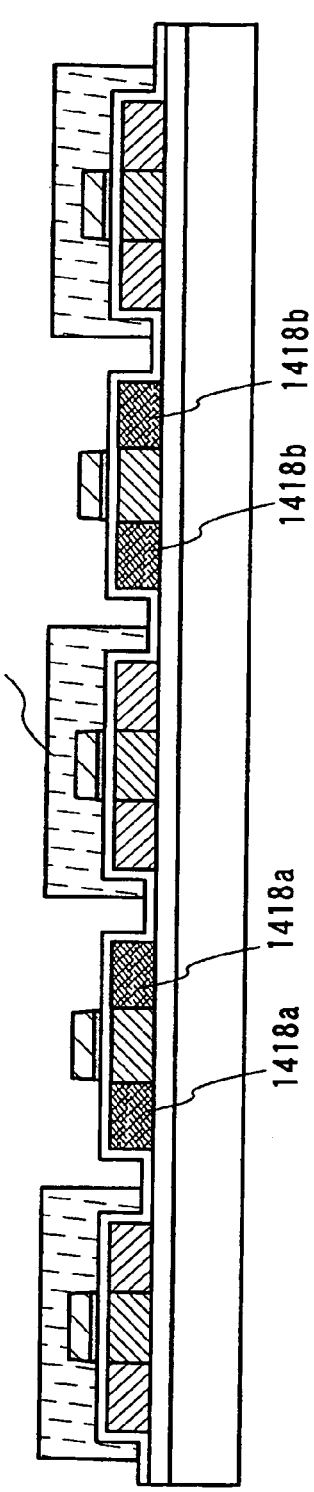

Next, the resist mask 1415 is removed and then, a resist mask 1417 is formed to cover the region to become an n-channel TFT. After that, boron B, which is an impurity element, is added in a self-alignment manner using the gate electrode as a mask as shown in FIG. 12B. With this step, impurity regions 1418a and 1418b are formed in the region to become a p-channel TFT.

Figure 12C:
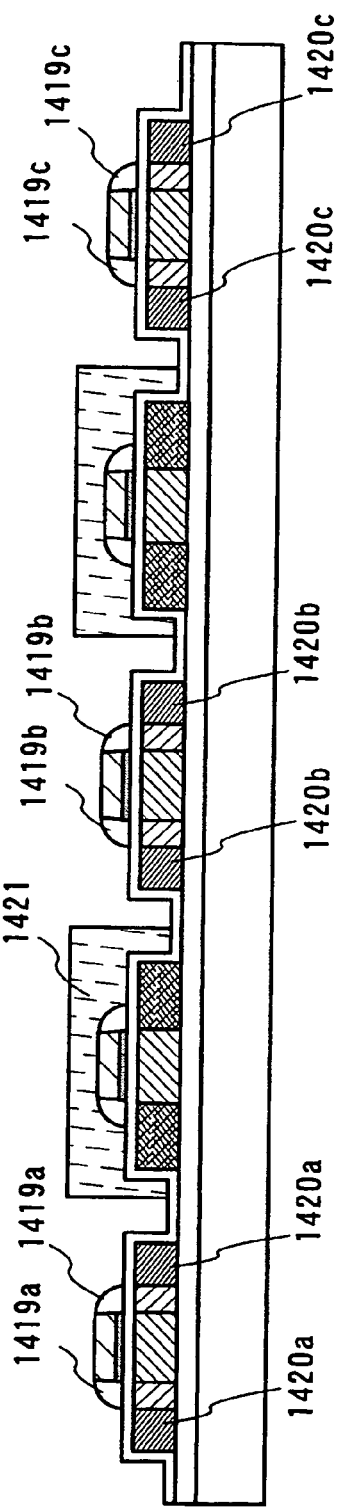

After removing the resist mask 1417, an insulating film covering the side of the gate electrode, so-called sidewalls 1419a to 1419c, is formed as shown in FIG. 12C. The sidewalls can be formed by etching appropriately after an insulating film containing silicon is formed by a plasma CVD method or a low-pressure CVD (LPCVD) method.

Next, a resist mask 1421 is formed over the p-channel TFT. Here, phosphine ($PH_3$) is added at 15 to 25 keV to form high-concentration impurity regions, so-called source and drain regions, are formed. With this step, high-concentration impurity regions 1420a to 1420c are formed in a self-alignment manner using the sidewalls 1419a to 1419c as masks as shown in FIG. 12C.

After that, the resist mask 1421 is removed by $O_2$ ashing or resist stripping solution.

Next, a heat treatment to activate each impurity region is conducted. Here, the impurity regions are activated by the laser irradiation method shown in Embodiment Mode 1. Note that the impurity regions may be activated by heating the substrate at a temperature of 550° C. in a nitrogen atmosphere.

Next, a first interlayer insulating film 1422 covering the gate insulating film 1408 and the gate electrode is formed. For the first interlayer insulating film 1422 an inorganic insulating film containing hydrogen such as a silicon nitride film is used.

After that, a heat treatment is conducted for hydrogenation. Dangling bonds in the silicon oxide film or the silicon film are terminated with hydrogen released from silicon nitride film, which is the first interlayer insulating film 1422.

Figure 13A:
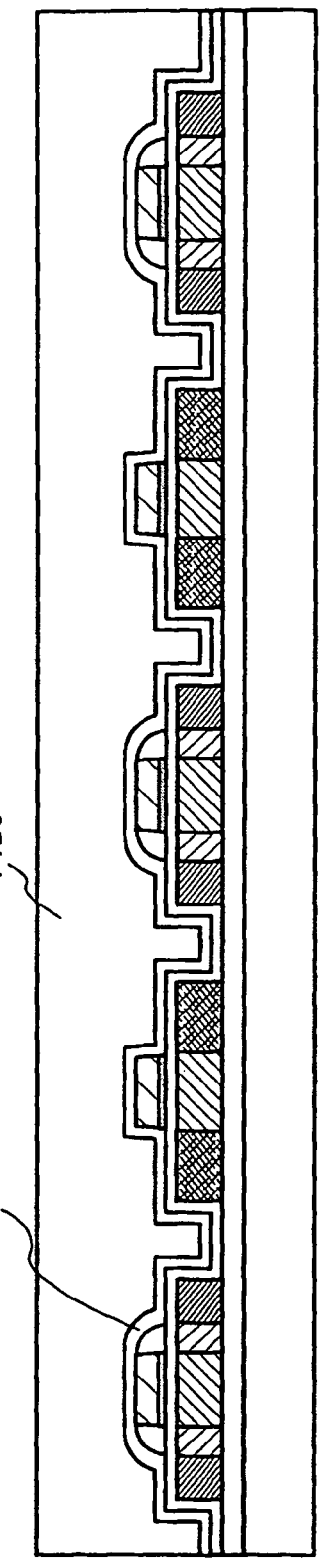
FIGS. 13A and 13B are cross-sectional views showing manufacturing steps of a CPU.

Then, a second interlayer insulating film 1423 is formed so as to cover the first interlayer insulating film 1422 as shown in FIG. 13A. The second interlayer insulating film 1423 can be formed with an inorganic material (such as silicon oxide, silicon nitride, or silicon nitride containing oxygen), a photosensitive or non-photosensitive organic material (polyimide, acrylic, polyamide, polyimide amide, resist, or benzocyclobutene), a material which includes a skeleton having a bond of silicon (Si) and oxygen (O) and includes at least hydrogen in a substituent or includes at least one of fluorine, alkyl group, and aromatic carbon hydrogen in a substituent, that is to say siloxane, and a multilayer structure of these.

Figure 13B:
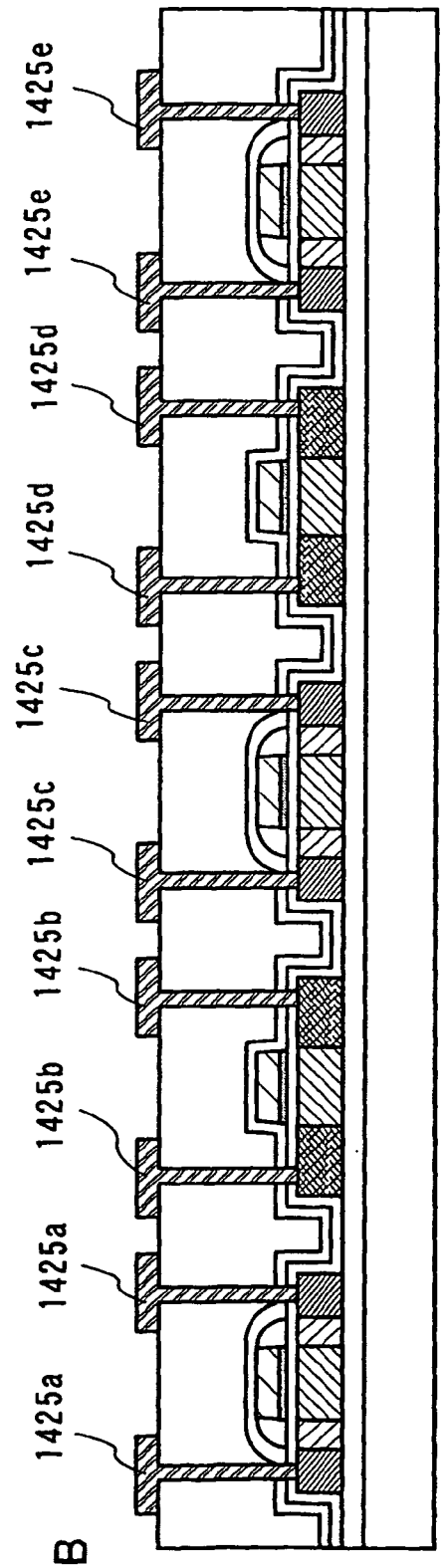

Next, an opening portion, a so-called contact hole is formed in the gate insulating film 1408, the first interlayer insulating film 1422, and the second interlayer insulating film 1423. Wirings 1425a to 1425e connected to each impurity region are formed as shown in FIG. 13B. Simultaneously, a wiring connected to the gate electrode is formed, if necessary. Note that those wirings are formed with a film formed with an element selected from aluminum (Al), titanium (Ti), molybdenum (Mo), tungsten (W), and silicon (Si), or an alloy film using these elements may be used. Further, those wirings may be formed with an aluminum alloy film containing carbon and at least one element selected from nickel, cobalt and iron.

In this way, an n-channel thin film transistor having a gate length of 1.0 μm or less and an LDD structure formed so as to have a low-concentration impurity region can be formed. Moreover, a p-channel thin film transistor having a gate length of 1.0 μm or less and a single-drain structure formed so as not to have a low-concentration impurity-region is completed. A TFT having a gate length of 1.0 μm or less can be referred to also as a submicron TFT. Since the deterioration due to the hot carrier and the short-channel effect are difficult to occur in the p-channel thin film transistor, the single-drain structure can be employed.

In the present invention, the p-channel thin film transistor may have the LDD structure. Further, both of the n-channel thin film transistor and the p-channel thin film transistor may have, instead of the LDD structure, a GOLD structure in which the low-concentration impurity region is overlapped with the gate electrode.

A semiconductor device having the thusly formed thin film transistor, which is a CPU in this embodiment mode, can be manufactured and high-speed operation at a drive voltage of 5 V and an operating frequency of 30 MHz becomes possible.

Figure 14:
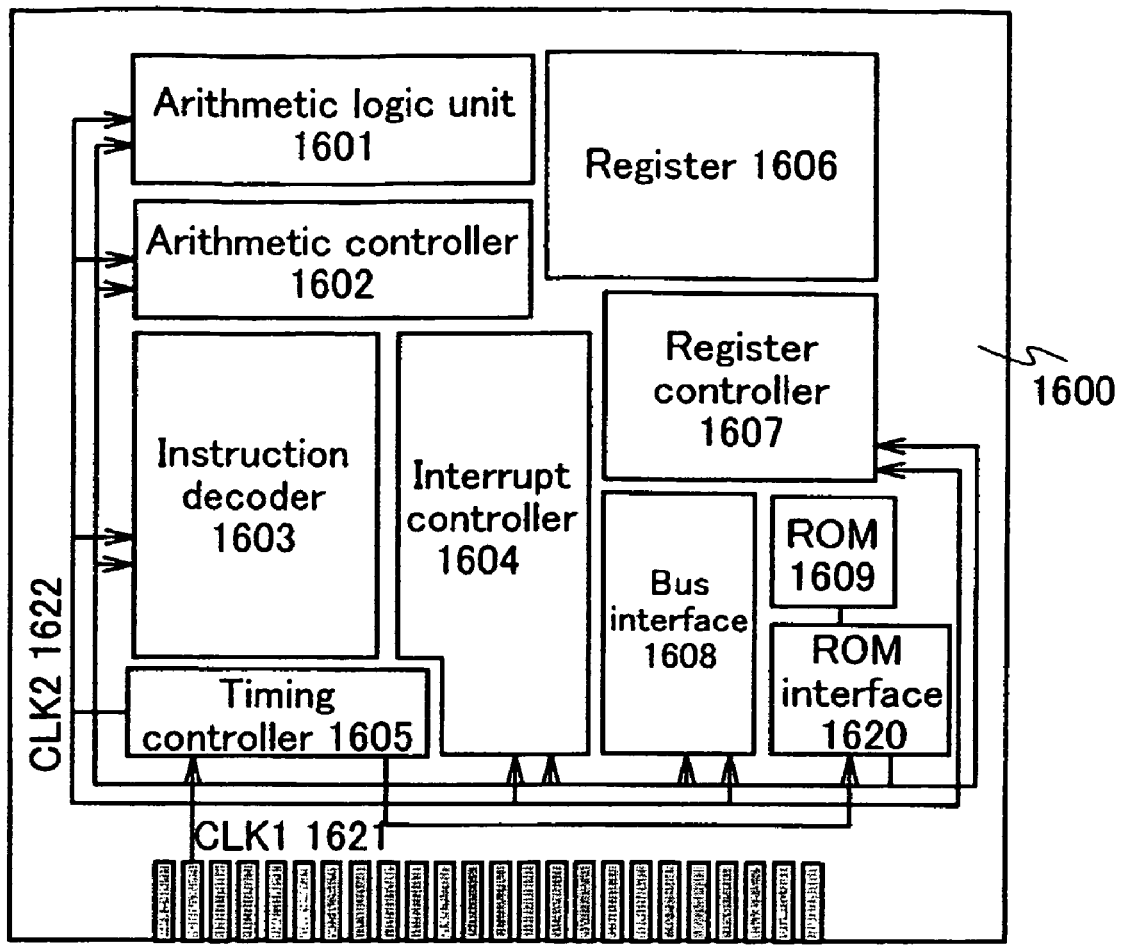
FIG. 14 is a block diagram of a CPU.

Next, an example of constituting various circuits with the above-mentioned thin film transistors is described with reference to FIG. 14. FIG. 14 shows a block diagram of a CPU formed over a glass substrate 1600.

The CPU shown in FIG. 14 mainly includes an arithmetic logic unit (ALU) 1601, an arithmetic logic unit controller (ALU controller) 1602, an instruction decoder 1603, an interrupt controller 1604, a timing controller 1605, a register 1606, a register controller 1607, a bus interface (Bus I/F) 1608, a rewritable ROM 1609, and a ROM interface (ROM I/F) 1620 over the glass substrate 1600. The ROM 1609 and the ROM I/F 1620 may be provided in another chip.

Of course, the CPU shown in FIG. 14 is just an example in which the structure is simplified, and actual CPUs have various structures according to their intended purposes.

An instruction inputted into the CPU through the bus interface 1608 is inputted into the instruction decoder 1603 and decoded, and then inputted into the arithmetic logic unit controller 1602, the interrupt controller 1604, the register controller 1607, and the timing controller 1605.

The arithmetic logic unit controller 1602, the interrupt controller 1604, the register controller 1607, and the timing controller 1605 conduct various controls based on the decoded instructions. Specifically, the arithmetic logic unit controller 1602 generates signals for controlling the operation of the arithmetic logic unit 1601. Further, the interrupt controller 1604 processes an interrupt request from a peripheral circuit or an external input/output device during the execution of a program of the CPU by judging based on the priority or the mask condition. The register controller 1607 generates an address of the register 1606 and reads out or writes in the register 1606 in accordance with the state of the CPU.

The timing controller 1605 generates signals for controlling the timing of the operation of the arithmetic logic unit 1601, the arithmetic logic unit controller 1602, the instruction decoder 1603, the interrupt controller 1604, and the register controller 1607. For example, the timing controller 1605 includes an internal clock generator that generates an internal clock signal CLK2 (1622) based on a standard clock signal CLK1 (1621), and supplies the clock signal CLK2 to the above-described various circuits.

Since laser irradiation can be conducted to a large area by one time scanning of a laser beam according to the present invention, a CPU can be manufactured at low cost.

In addition, this embodiment mode can be freely combined with Embodiment Modes 1 to 4.

EMBODIMENT MODE 6

Here, an example of manufacturing an IC tag according to the present invention is shown with reference to FIG. 15A to 15E, FIG. 16A to 16E, FIGS. 17A to 17C, FIG. 18A and FIG. 18B.

Although this embodiment mode shows an example of an isolated and insulated TFT as a semiconductor element used for an integrated circuit of an IC tag, the semiconductor element used for an integrated circuit of an IC tag is not limited to the TFT, and any elements can be used. For example, besides the TFT, a storage element, a diode, a photoelectric conversion element, a resistance element, a coil, a capacitor element, an inductor, and the like are typically given.

Figure 15A:
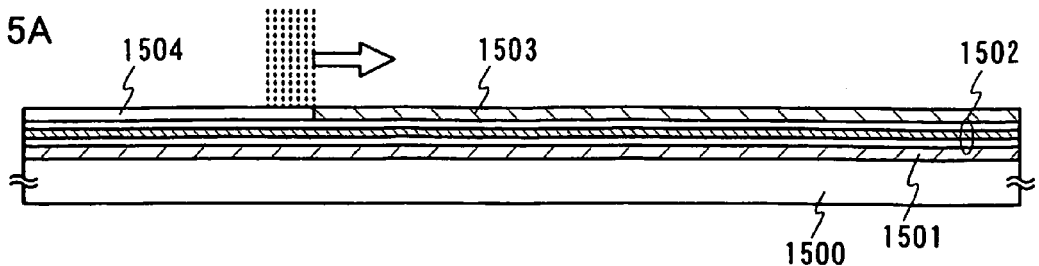
FIGS. 15A to 15E are cross-sectional views showing manufacturing steps of an IC tag.

First, as shown in FIG. 15A, a peeling layer 1501 is formed over a glass substrate (a first substrate) 1500 by a sputtering method. The peeling layer 1501 can be formed by a sputtering method, a low pressure CVD method, a plasma CVD method or the like. In this embodiment mode, amorphous silicon with a thickness of about 50 nm is formed by a low pressure CVD method, and used as the peeling layer 1501. The material for the peeling layer 1501 is not limited to silicon, other materials that can be removed selectively by etching (for example, W, Mo, or the like) can be used for forming the peeling layer 1501. The thickness of the peeling layer 1501 is preferably 50 to 60 nm.

Next, a base insulating film 1502 is formed over the peeling layer 1501. The base insulating film 1502 is formed to prevent an alkali-earth metal or an alkali metal such as Na contained in the first substrate from diffusing into the semiconductor film to adversely affect the characteristic of a semiconductor element such as a TFT. The base insulating film 1502 also has a function of protecting the semiconductor element in a later step of peeling the semiconductor element. The base insulating film 1502 may be a single layer or may have plural insulating films which have been stacked. Therefore, an insulating film, such as silicon oxide, silicon nitride, silicon oxide containing nitrogen (SiON), or silicon nitride containing oxygen (SiNO), which can prevent the diffusion of an alkali metal or an alkali-earth metal into a semiconductor film is used.

Next, a semiconductor film is formed over the base insulating film 1502. A semiconductor film 1503 is desirably formed without being exposed to the air after forming the base insulating film 1502. The thickness of the semiconductor film is set to 20 to 200 nm (desirably 40 to 170 nm, preferably 50 to 150 nm).

In addition, the semiconductor film 1503 is irradiated with a laser light, which is a fundamental wave, so that multiphoton absorption is produced for crystallization, in accordance with Embodiment Mode 1. Thus, crystallization is completed. A crystalline semiconductor film 1504 is formed by irradiating the semiconductor film 1503 with laser light. Note that FIG. 15A is a cross sectional view showing a state in which laser light is scanned.

Figure 15B:
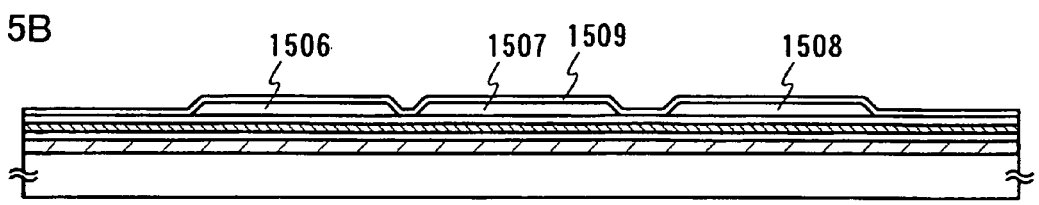

Then, a gate insulating film 1509 is formed after island-shaped semiconductor films 1506 to 1508 are formed by etching selectively the semiconductor film 1504 having a crystalline structure as shown in FIG. 15B. The gate insulating film 1509 can be formed with a single layer or a multilayer of a film containing silicon nitride, silicon oxide, silicon oxide containing nitrogen, or silicon nitride containing oxygen by a plasma CVD method, a sputtering method, or the like.

After forming the gate insulating film 1509, a heat treatment may be performed in an atmosphere including hydrogen for 3% or more at a temperature of 300 to 450° C. for 1 to 12 hours (this treatment is also referred to as hydrogenation) in order to hydrogenate the island-shaped semiconductor films 1506 to 1508. As another means for the hydrogenation, plasma hydrogenation (using hydrogen excited by plasma) may be performed.

Figure 15C:
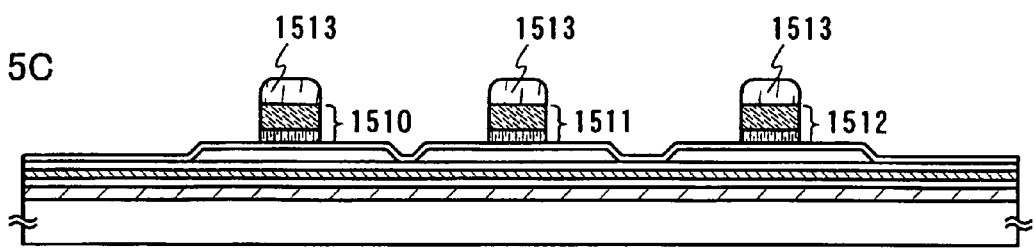

Next, as shown in FIG. 15C, gate electrodes 1510 to 1512 are formed. Here, the gate electrodes 1510 to 1512 are formed by stacking Si and W by a sputtering method and then, etching them with the use of a resist 1513 as a mask. It is natural that the conductive materials, the structures, and the manufacturing method of these gate electrodes 1510 to 1512 are not limited to these, and they can be selected appropriately. For example, the gate electrodes may have a multilayer structure of NiSi (nickel silicide) and Si doped with an impurity imparting n-type conductivity or a multilayer structure of TaN (tantalum nitride) and W (tungsten). Moreover, the gate electrodes may be a single layer formed with various kinds of conductive materials. In addition, in the case where the gate electrode and an antenna are formed simultaneously, materials may be selected in consideration of the functions of those.

A mask of $SiO_x$ or the like may be used instead of the resist mask. In this case, a step of forming a mask of $SiO_x$, SiON or the like (also, referred to as a hard mask) by selectively etching is added. However, since the decrease in a film thickness of the mask at the etching is less than the resist, the gate electrodes 1510 to 1512 having the desired widths can be formed. Alternatively, the gate electrodes 1510 to 1512 may be formed selectively by a droplet-discharge method without using the resist 1513.

Figure 15D:
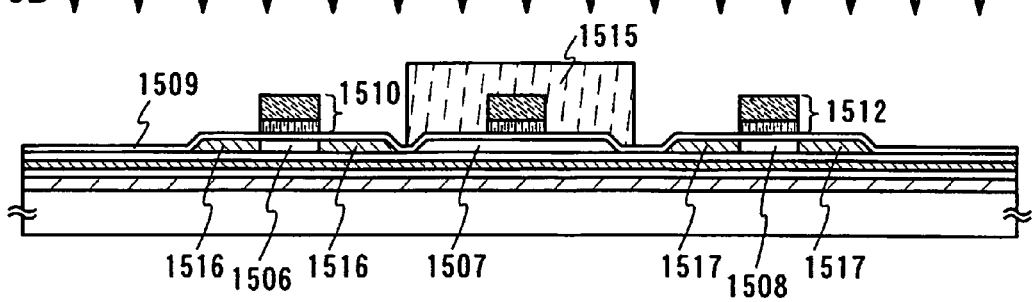

Next, as shown in FIG. 15D, the island-shaped semiconductor film 1507 to become a p-channel TFT is covered with a resist 1515, and then the island-shaped semiconductor films 1506 and 1508 are doped at a low-concentration with an impurity element imparting n-type conductivity (typically, P (phosphorus) or As (arsenic)) by using the gate electrodes 1510 and 1512 as masks. In this doping step, the doping is performed through the gate insulating film 1509, and a pair of low-concentration impurity regions 1516 and 1517 is formed in the island-shaped semiconductor films 1506 and 1508. It is to be noted that the doping step may be performed without covering the island-shaped semiconductor film 1507 to become a p-channel TFT with a resist.

Figure 15E:
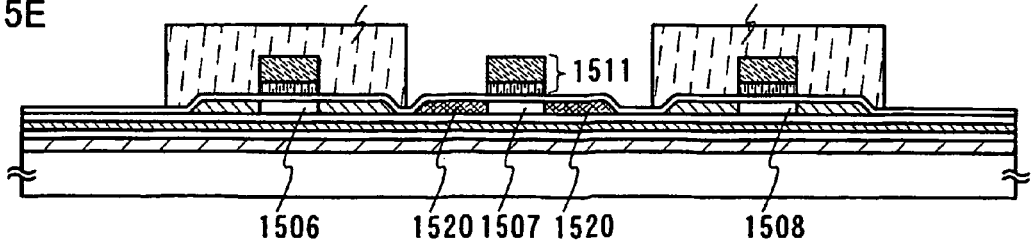

Next, as shown in FIG. 15E, after removing the resist 1515 by ashing or the like, a resist 1518 is formed anew so as to cover the island-shaped semiconductor films 1506 and 1508 to become n-channel TFTs. Then, the island-shaped semiconductor film 1507 is doped with an impurity element imparting p-type conductivity (typically B (boron)) at high-concentration by using the gate electrode 1511 as a mask. In the doping step, the doping is performed through the gate insulating film 1509, and a pair of p-type high-concentration impurity regions 1520 is formed in the island-shaped semiconductor film 1507.

Figure 16A:
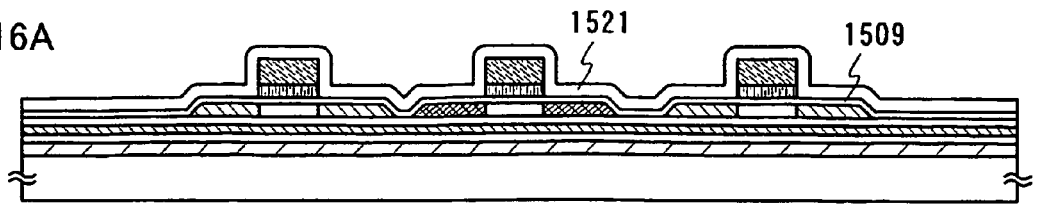
FIGS. 16A to 16E are cross-sectional views showing manufacturing steps of an IC tag.

Next, an insulating film 1521 is formed so as to cover the gate insulating film 1509 and the gate electrodes 1510 to 1512 after removing the resist 1518 by ashing or the like as shown in FIG. 16A.

Figure 16B:
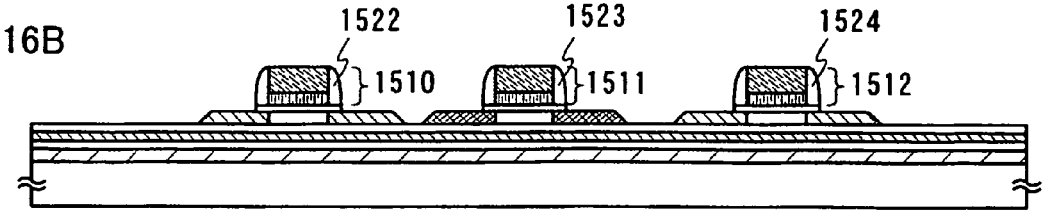

Next, the insulating film 1521 and the gate insulating film 1509 are etched partially by an etch-back method to form sidewalls 1522 to 1524 which are in contact with the side of the gate electrodes 1510 to 1512 in a self-alignment manner as shown in FIG. 16B. As an etching gas, a mixed gas of $CHF_3$ and He is used. Note that the step of forming a sidewall is not limited to this.

Figure 16C:
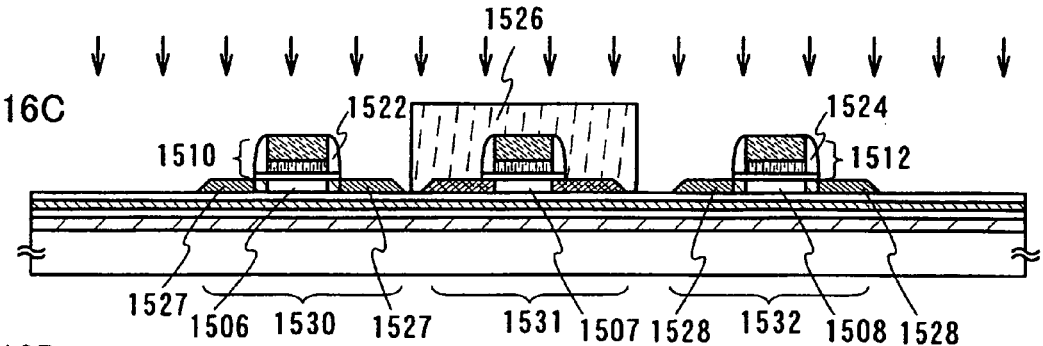

After that, a resist 1526 is formed anew to cover the island-shaped semiconductor film 1507 to become a p-channel TFT, and an impurity element imparting n-type conductivity (typically P or As) is added at high-concentration using the gate electrodes 1510 and 1512, and side walls 1522 and 1524 as masks as shown in FIG. 16C. By this doping step, island-shaped semiconductor films 1506 and 1508 are doped through the gate insulating film 1509, and a pair of n-type high-concentration impurity regions 1527 and 1528 is formed.

After removing the resist 1526 by ashing or the like, thermal activation of the impurity region may be performed. For example, after forming a SiON film having a thickness of 50 nm, a heat treatment may be performed for four hours under a nitrogen atmosphere at 550° C. When a $SiN_x$ film containing hydrogen is formed with 100 nm thick and then, a heat treatment is performed thereto for one hour under a nitrogen atmosphere at 410° C., a defect in the polycrystal semiconductor film can be improved. This is for the purpose of terminating the dangling bonds existing in, for example, the polycrystal semiconductor film and is called a hydrogenation treatment or the like.

According to a series of the above-mentioned steps, an n-channel TFT 1530, a p-channel TFT 1531, and an n-channel TFT 1532 are formed. When the size of the sidewall is adjusted by changing the condition of an etch-back method appropriately in these manufacturing steps, a TFT having a channel length of 0.2 to 2 μm can be formed.

After that, a passivation film may be formed to protect the TFTs 1530 to 1532.

Figure 16D:
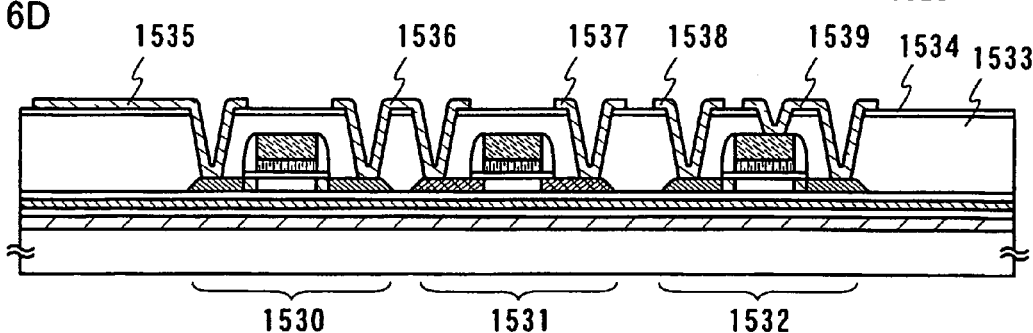
Figure 16E:
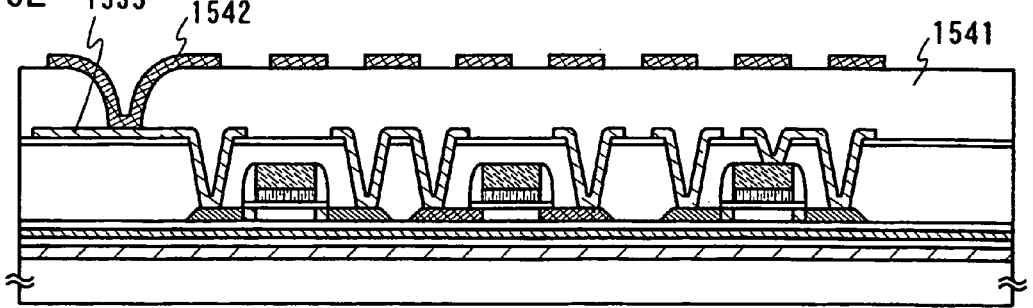

Next, a first interlayer insulating film 1533 is formed so as to cover the TFTs 1530 to 1532 as shown in FIG. 16D.

Further, a second interlayer insulating film 1534 is formed over the first interlayer insulating film 1533. A filler may be mixed into the first interlayer insulating film 1533 or the second interlayer insulating film 1534 in order to prevent the first interlayer insulating film 1533 or the second interlayer insulating film 1534 from peeling and being damaged due to the stress caused by a difference in the coefficient of thermal expansion between a conductive material or the like for constituting a wiring to be formed afterward and the first interlayer insulating film 1533 or the second interlayer insulating film 1534.

Next, as shown in FIG. 16 (D), contact holes are formed in the first interlayer insulating film 1533, the second interlayer insulating film 1534, and the gate insulating film 1509, and wirings 1535 to 1539 to connect with the TFTs 1530 to 1532 are formed. Note that wiring 1535 and 1536 are connected to a high-concentration impurity region 1527 of a n-channel TFT 1530, wirings 1536 and 1537 are connected to a high-concentration impurity region 1520 of a p-channel TFT 1531, and wirings 1538 and 1539 are connected to a high-concentration impurity region 1528 of a n-channel TFT 1532. Moreover, the wiring 1539 is connected to a gate electrode 1512 of the n-channel TFT 1532. Note that the n-channel TFT 1532 can be used as a memory element of a random ROM.

Next, as shown in FIG. 16 E, a third interlayer insulating film 1541 is formed over the second interlayer insulating film 1534 so as to cover the wirings 1535 to 1539. The third interlayer insulating film 1541 is formed so as to have an opening portion at a location for partially exposing the wiring 1535. The third interlayer insulating film 1541 can be formed with the same material as the first interlayer insulating film 1533.

Next, an antenna 1542 is formed over the third interlayer insulating film 1541. The antenna 1542 can be formed with a conductive material having one or a plurality of metal such as Ag, Au, Cu, Pd, Cr, Mo, Ti, Ta, W, Al, Fe, Co, Zn, Sn, and Ni or metal compounds. The antenna 1542 is connected to the wiring 1535. Although the antenna 1542 is directly connected to the wiring 1535 in FIG. 16 E, the IC tag of the present invention is not limited to this structure. For example, the antenna 1542 may be electrically connected with the wiring 1535 by using a wiring separately formed.

The antenna 1542 can be formed by a printing method, a photolithography method, an evaporation method, a droplet-discharge method, or the like. In FIG. 16 E, the antenna 1542 is formed with a single layer of a conductive film. However, the antenna 1542 can be formed by stacking a plurality of conductive films. For example, the antenna 1542 may be formed with a wiring which has been made of Ni or the like and which is coated with Cu by electroless plating.

The droplet-discharge method is a method for forming a predetermined pattern by discharging a droplet including a predetermined composition from a small nozzle hole. An ink-jet method and the like are included in the category. On the other hand, the printing method includes a screen printing method, an offset printing method, and the like. When the printing method or the droplet-discharge method is employed, the antenna 1542 can be formed without using the mask for the light exposure. Moreover, when the printing method or the droplet-discharge method is employed, unlike the photolithography method, the material that will be etched away can be saved. Moreover, since the expensive mask for the light exposure is not necessary, the cost for manufacturing an IC tag can be reduced.

In the case of employing the droplet-discharge method or various kinds of printing methods, for example, a conductive particle of Cu coated with Ag can also be used. When the antenna 1542 is formed by a droplet-discharge method, it is desirable to perform a process for improving the adhesiveness of the antenna 1542 to a surface of the third interlayer insulating film 1541.

As methods for improving the adhesiveness, specifically, a method in which metal or a metal compound that can improve the adhesiveness of the conductive film or the insulating film due to the catalyst action is attached to the surface of the third interlayer insulting film 1541, a method in which an organic insulating film, a metal, or a metal compound having high adhesiveness to a conductive film or an insulating film to be formed is attached to the surface of the third interlayer insulating film 1541, a method in which a plasma process is performed to the surface of the third interlayer insulating film 1541 under atmospheric pressure or reduced pressure so that the surface thereof is modified, and the like are given.

When the metal or the metal compound attached to the third interlayer insulating film 1541 is conductive, the sheet resistance is controlled so that the normal operation of the antenna is not interrupted. Specifically, the average thickness of the conductive metal or metal compound may be controlled so as to range from 1 to 10 nm, for example. Moreover, the metal or the metal compound may be insulated partially or totally by oxidization. Alternatively, the attached metal or metal compound may be etched selectively except in the region where the adhesiveness needs to be improved. The metal or the metal compound may be attached selectively only to a particular region by a droplet-discharge method, a printing method, or a sol-gel method instead of attaching the metal or the metal compound to the whole surface of the substrate. The metal or the metal compound is not necessarily a totally continuous film on the surface of the third interlayer insulating film 1541 but may be dispersed to some extent.

Figure 17A:
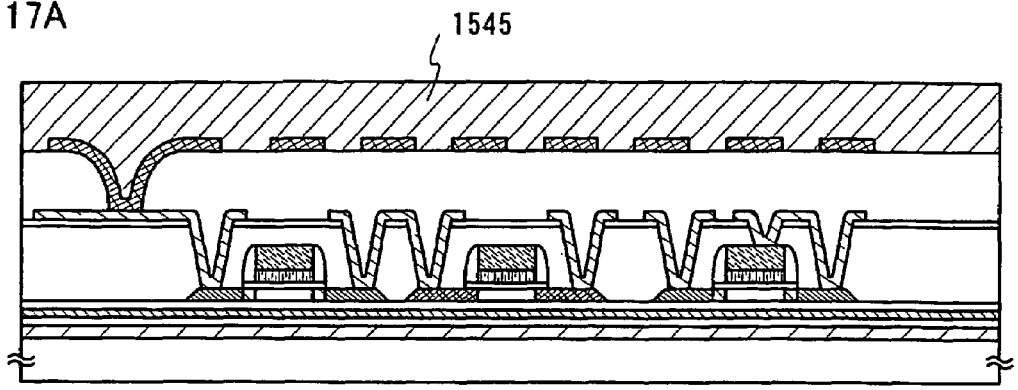
FIGS. 17A to 17C are cross-sectional views showing manufacturing steps of an IC tag.

Then, as shown in FIG. 17A, after forming the antenna 1542, a protective layer 1545 is formed over the third interlayer insulating film 1541 so as to cover the antenna 1542. The protective layer 1545 is formed with a material capable of protecting the antenna 1542 when the peeling layer 1501 is etched afterward. For example, the protective layer 1545 can be formed by applying epoxy based resin, acrylate based resin, or silicon based resin which can dissolve in water or alcohols to the whole surface.

Figure 17B:
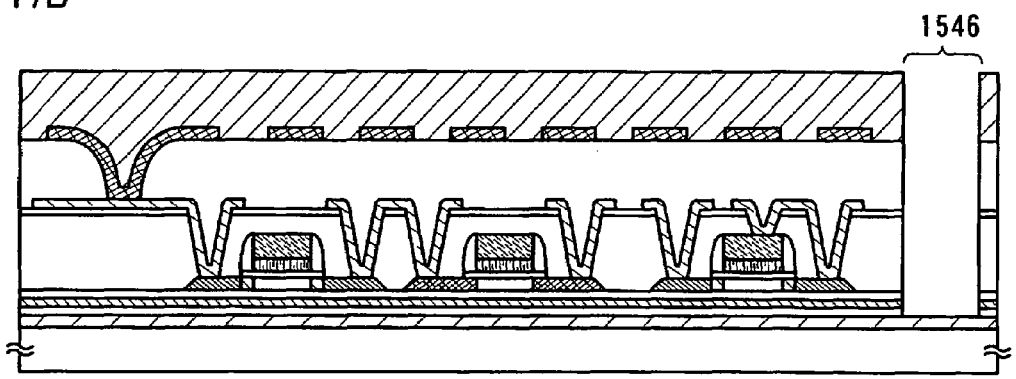

Next, as shown in FIG. 17B, a groove 1546 is formed in order to divide IC tags from each other. The groove 1546 may have such a depth that the peeling layer 1501 is exposed. The groove 1546 can be formed by dicing or scribing. It is to be noted that the groove 1546 is not necessarily formed when it is not required to divide the IC tags formed over the first substrate 1500.

Figure 17C:
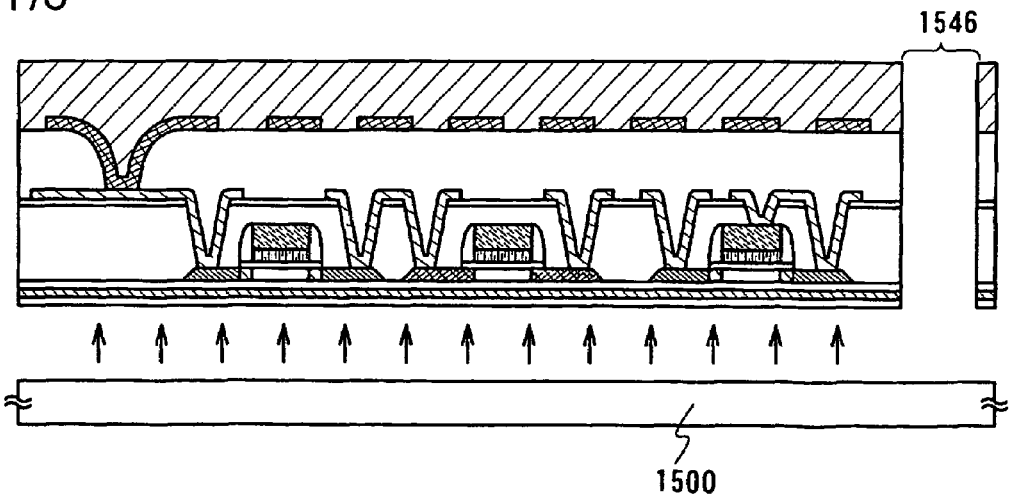

Next, as shown in FIG. 17C, the peeling layer 1501 is removed by etching. Here, halogen fluoride as an etching gas is introduced from the groove 1546. For example, $ClF_3$ (chlorine trifluoride) is used under a condition where the temperature is 350° C., the flow rate is 300 sccm, the air-pressure is 798 pascal (798 Pa), and the time is 3 hours. Moreover, a gas in which nitrogen is mixed into $ClF_3$ gas may be used. The peeling layer 1501 can be selectively etched by using the halogen fluoride such as $ClF_3$ so that the TFTs 1530 to 1532 can be peeled from the first substrate 1500. The halogen fluoride may be either gas or liquid.

A method for peeling an integrated circuit including a TFT from an insulating substrate is not limited to the method of etching an amorphous silicon film as shown in this embodiment mode, and other various methods can be employed. For example, a metal oxide film is provided between a substrate having high heat resistance and an integrated circuit and then, the metal oxide film is weakened. Thereafter, peeling is conducted so that the integrated circuit including a TFF provided over the metal oxide film can be peeled. Moreover, at least a portion of the peeling layers is destroyed by laser irradiation so that an integrated circuit including a TFT can be peeled from a substrate. In addition, an integrated circuit including a TFT can be peeled from a substrate by eliminating mechanically a substrate in which an integrated circuit including a TFT is formed, or removing a substrate by etching with solution or gas.

Figure 18A:
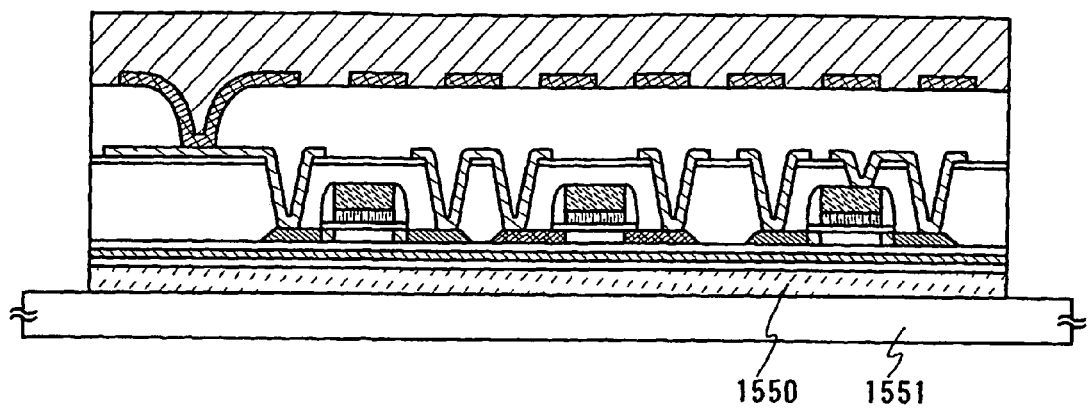
FIGS. 18A and 18B are cross-sectional views showing manufacturing steps of an IC tag.

Next, as shown in FIG. 18A, the peeled TFTs 1530 to 1532 and the antenna 1542 are pasted to a second substrate 1551 by using an adhesive agent 1550. As the adhesive agent 1550, a material which can paste the second substrate 1551 and the base insulating film 1502 is used. As the adhesive agent 1550, various kinds of curable adhesive agents can be employed: for example, a reactive-curable type adhesive agent, a thermosetting type adhesive agent, a photo-curable type adhesive agent such as a UV-curable type adhesive agent, or an anaerobic type adhesive agent.

The second substrate 1551 can be formed with a flexible organic material such as paper or plastic.

Figure 18B:
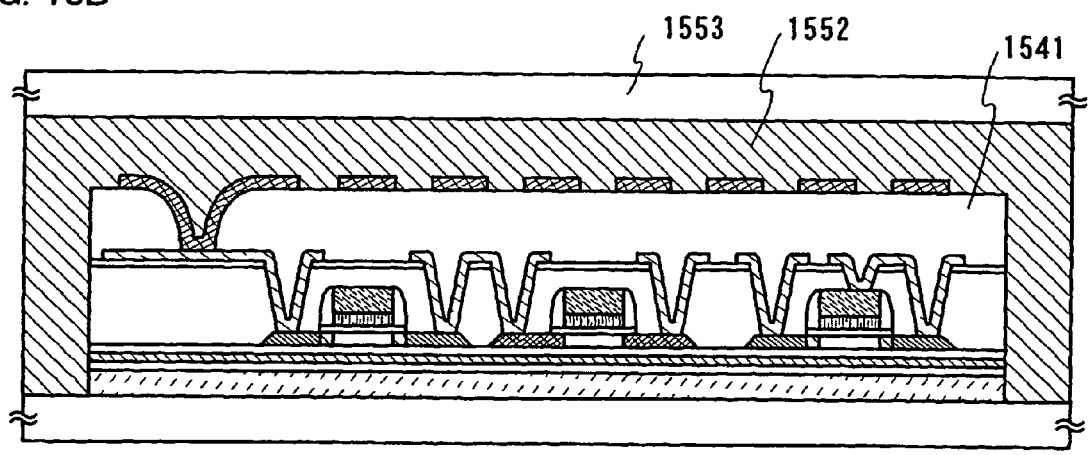

As shown in FIG. 18B, after removing the protective layer 1545, an adhesive agent 1552 is applied onto the third interlayer insulating film 1541 so as to cover the antenna 1542, and then a cover material 1553 is pasted. As the cover material 1553, a flexible organic material such as paper or plastic can be used like the second substrate 1551. The thickness of the adhesive agent 1552 may be set, for example, in the range of 10 to 200 μm.

As the adhesive agent 1552, a material which can paste the cover material 1553 with the third interlayer insulating film 1541 and the antenna 1542, is used. As the adhesive agent 1552, various kinds of curable adhesive agents can be used: for example, a reactive-curable type adhesive agent, a thermosetting type adhesive agent, a photo-curable type adhesive agent such as a UV-curable type adhesive agent, or an anaerobic type adhesive agent.

Through the above-mentioned steps, an IC tag is completed. Through the above manufacturing method, an extremely thin integrated circuit having the total thickness in the range of 0.3 to 3 μm, typically about 2 μm, can be formed between the second substrate 1551 and the cover material 1553.

The thickness of the integrated circuit includes not only the thickness of the semiconductor element itself but also the thickness of various insulating films and interlayer insulating films formed between the adhesive agent 1550 and the adhesive agent 1552. The area in the IC tag which is occupied by an integrated circuit can be set to a 5-mm-square or less (25 $mm^2$ or less), more preferably in the range of approximately 0.3-mm-square (0.09 $mm^2$) to 4-mm-square (16 $mm^2$) on a side.

Although this embodiment mode has described a method of peeling the substrate from the integrated circuit by providing a peeling layer between the first substrate 1500 having high heat resistance and an integrated circuit, and etching the peeling layer, the method for manufacturing an IC tag of the present invention is not limited to this method. For example, a metal oxide film may be provided between the integrated circuit and the substrate having high heat resistance, and the metal oxide film may be weakened by crystallization so that the integrated circuit is peeled. Alternatively, the peeling layer formed with an amorphous semiconductor film containing hydrogen may be provided between the integrated circuit and the substrate having high heat resistance, and the peeling layer may be removed by laser irradiation so as to peel the substrate from the integrated circuit. Alternatively, the integrated circuit may be separated from the substrate by mechanically removing the substrate having high heat resistance over which the integrated circuit is formed or by etching the substrate using a solution or a gas.

Although this embodiment mode has described the example for forming the antenna over the same substrate as the integrated circuit, the present invention is not limited to this structure. The antenna and the integrated circuit each of which is formed over a different substrate may be pasted to each other afterward so that they are connected electrically.

The frequency of the electric wave usually used in RFIC is 13.56 MHz or 2.45 GHz, and it is extremely important to form the IC tag so that these frequencies of the electric wave can be detected in order to enhance the versatility.

The IC tag of this embodiment mode has advantages that the IC tag blocks almost no electric waves, as compared to the RFIC formed using a semiconductor substrate and that attenuation of signals due to blocking of electric waves can be prevented. Since the semiconductor substrate is not necessary, the cost for manufacturing the IC tag can be reduced drastically.

Although this embodiment mode has described the example in which the peeled integrated circuit is pasted to the flexible substrate, the present invention is not limited to this structure. For example, when a substrate having allowable temperature limit which can resist a heat treatment in the manufacturing steps of the integrated circuit, such as a glass substrate, is used, the integrated circuit is not necessarily peeled.

This embodiment can be freely combined with Embodiment Modes 1 to 5.

EMBODIMENT MODE 7

A TFT manufactured using the laser irradiation apparatus of the present invention can be used for various electronic devices. As the electronic device, cameras such as video cameras or digital cameras, goggle-type displays, navigation systems, sound reproduction devices (car audio compositions, audio compositions, and the like), personal computers, game machines, mobile information terminals (mobile computers, mobile phones, mobile game machines, electronic books, and the like), image reproduction devices equipped with a recording medium (specifically, devices which can reproduce a recording medium such as Digital Versatile Disk (DVD) and have a display for displaying the image), and the like are given.

Since the present invention can conduct a laser irradiation process favorably to a semiconductor film, it is possible to increase the freedom degree of layout or size of a semiconductor element and improve the integration degree. Moreover, it is possible to eliminate a variation since the quality of the manufactured semiconductor element is in preferable state. The specific example is showed with reference to FIGS. 19A to 19C.

Figure 19A:
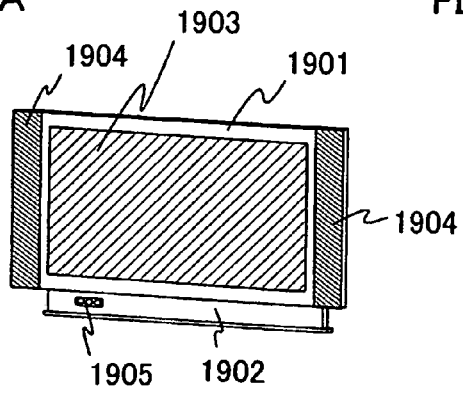
FIGS. 19A to 19E each show one example of electronic devices.

FIG. 19A shows a display device including a casing 1901, a support 1902, a display portion 1903, speaker portions 1904, a video input terminal 1905 and the like. The display device is manufactured using a thin film transistor formed by the manufacturing method shown in other embodiment modes to its display portion 1903 and its driving circuit. The display device indicates a liquid crystal display device, a light emitting device and the like, and it includes all display devices for information display, for example, ones for a computer, a TV receiving, and an advertising display.

Figure 19B:
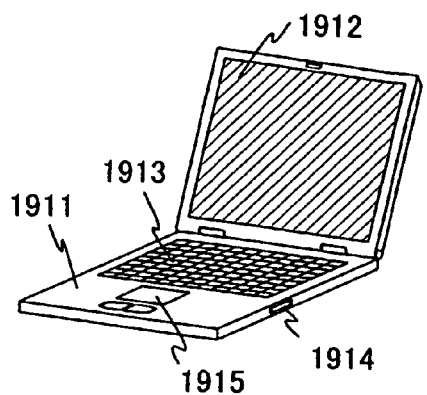

FIG. 19B shows a personal computer including a casing 1911, a display portion 1912, a keyboard 1913, an external connection port 1914, a pointing mouse 1915, and the like. By using the manufacturing method shown in the above mentioned embodiment mode, it can be applied to the display portion 1912, other circuit portions, and the like. Further, the present invention can be applied to a CPU inside the main body, a semiconductor device such as a memory, and the like.

Figure 19C:
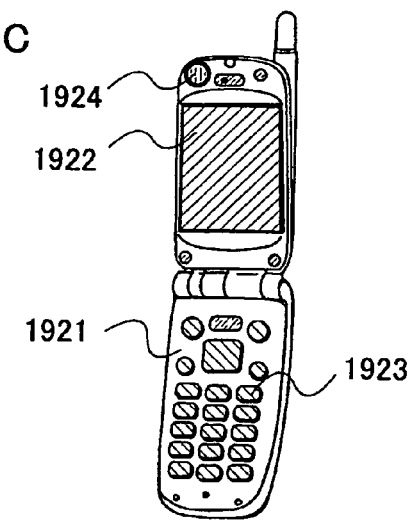

FIG. 19C shows a mobile phone, and a typical example of mobile information terminal. The mobile phone includes a casing 1921, a display portion 1922, a sensor portion 1924, operation keys 1923, and the like. The sensor portion 1924 has an optical sensor element, and the amount of consumption current of the mobile phone can be suppressed by controlling the brightness of the display portion 1922 based on the illumination intensity obtained by the sensor portion 1924, conducting the lighting control of the operation keys 1923 corresponding to the illumination intensity obtained by the sensor portion 1924. In addition, in the case of a mobile phone having an imaging function such as a CCD or the like, whether a person who takes a picture looks in an optical finder or not is detected as the amount of light received by a sensor of the sensor portion 1924 provided in the vicinity of the optical finder changes. In the case where a person who takes a picture looks in the optical finder, the amount of electric power consumption can be suppressed by making off the display portion 1922.

The display screen of electronic devices such as the above mentioned mobile phone, a PDA (Personal Digital Assistants), a digital camera, a compact game machine or the like, is small, since these electronic devices are each a mobile information terminal. Therefore, by forming functional circuits such a CPU, a memory, a sensor with using a minute transistor shown in the above mentioned embodiment mode, electronic devices can be smaller and lighter.

The TFT manufactured by using the laser irradiation device of the present invention can be used as a thin film integrated circuit or a non-contact thin film integrated circuit device (also, referred to as Radio Frequency IC tag, RFID (Radio Frequency Identification)). Moreover, such as a distribution route of the electronic devices can be revealed by attaching an IC tag to various electronic devices. The specific example is showed with reference to FIGS. 19D and 19E.

Figure 19D:
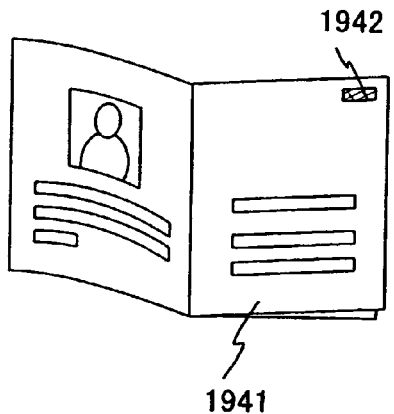

FIG. 19D shows a state in which a radio frequency IC tag 1942 is attached to a passport 1941. The passport 1941 may be embedded in the radio frequency IC tag. In the same manner, the radio frequency IC tag can be attached to or embedded in a driver's license, a credit card, cash, coin, securities, a gift certificate, a ticket, a traveler's check (T/C), insurance, a residence certificate, a family register, and the like. In this case, only the information showing the real one is inputted into the radio frequency IC tag and an access right is set to prevent illegal reading or writing of information. This can be realized by using a memory shown in another embodiment mode. By using it as a tag, in this manner, it is possible to distinguish a counterfeit from the real one.

Figure 19E:
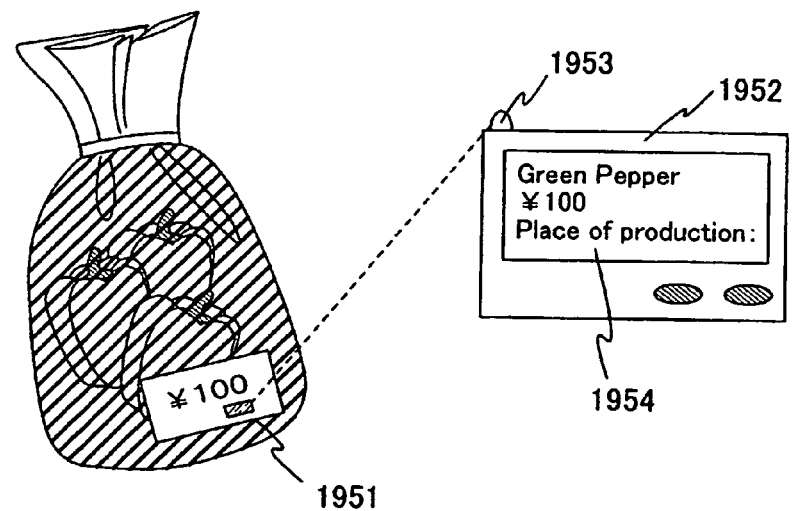

In addition to the above, the radio frequency IC tag can also be used as a memory. FIG. 19E shows an example in which the radio frequency IC tag 1951 is attached to a label attached to a vegetable wrapping. Also, the radio frequency IC tag may be attached to or embedded in the wrapping itself. The radio frequency IC tag 1951 can record process of commodity circulation, price, numerical quantity, use application, shape, weight, expire date, various identification information, etc, and stages of a production process such as place of production, producer, date of manufacture, processing method, etc. The information from the radio frequency IC tag 1951 is read by receiving it with an antenna portion 1953 of a wireless reader 1952, and displaying on a display portion 1954 of the reader 1952. Thus, the information can be easily known by a dealer, a retail seller, and a consumer. In addition, by providing the access right to each producer, trader, and consumer, it is set so that a person who does not have an access right cannot read, write, change or erase information.

Further, the radio frequency IC tag can be used as below. In stores, the information that payment has been made is written in the radio frequency IC tag, and whether payment has been made or not is checked at a provided checking device at an entrance. If people leave the stores without payment, an alarm rings. By this method, forgetting payment or shoplifting can be prevented.

In considering the privacy protection of customers, the following methods are possible. Either of the methods is employed when the payment is made: (1) the data inputted in the radio frequency IC tag is locked with a code number; (2) the data itself inputted in the radio frequency IC tag is encrypted; (3) the data inputted in the radio frequency IC tag is erased; or (4) the data inputted in the radio frequency IC tag is destroyed. These methods can be realized by using a memory shown in the above described embodiment modes. A checking device is provided at an entrance, and whether or not either of the processes (1) to (4) is conducted, or whether nothing is written in the data in the radio frequency IC tag is checked, in order to check whether payment has been made. In this manner, it is possible to check whether payment has been made in stores, and it can prevent the information in the radio frequency IC tag to be read without the holder's intention outside of stores.

The manufacturing cost of the above mentioned radio frequency IC tag is higher than that of a barcode used conventionally. Thus, it is necessary to reduce the cost. By the present invention, the width of a region of large grain crystals formed by one time scanning can be increased. In addition, the rate of border portion of adjacent crystalline regions (in other words, micro crystalline region) dramatically decrease more than ever before. Thus, the semiconductor element can be formed without waste, so that it is effective for cost reduction. Further, it is possible to manufacture all radio frequency IC tags with high quality and without variations of its function.

As mentioned above, the applicable range of a semiconductor device manufactured by the present invention is extremely large, and a semiconductor device manufactured by the present invention can be used for various electronic devices.

In addition, this embodiment mode can be freely combined with Embodiment Modes 1 to 6.

INDUSTRIAL APPLICABILITY

According to the present invention, a laser beam with an extremely high output power can be obtained without using a nonlinear optical element for converting a wavelength. Therefore, the width of a region of large grain crystals formed by one time scanning can be increased so that the productivity can be increased dramatically.

This application is based on Japanese Patent Application serial No. 2004-306140 filed in Japan Patent Office on Oct. 20, 2004, the entire contents of which are hereby incorporated by reference.

The invention claimed is:

1. A method of manufacturing a semiconductor device comprising the steps of:
    forming a semiconductor layer over a substrate;
    emitting a laser beam which is a fundamental wave from a laser oscillator;
    delivering the laser beam onto the semiconductor layer;
    crystallizing the semiconductor layer by irradiating with the laser beam which generates multiphoton absorption while moving the surface of the semiconductor layer relatively to the laser beam;
    forming an insulating layer over the crystallized semiconductor layer;
    forming a conductive layer over the crystallized semiconductor layer with the insulating layer interposed therebetween.

2. The method of manufacturing the semiconductor device according to claim 1,
    wherein the laser beam which is a fundamental wave is oscillated with a pulse width of 1 femtosecond or more and 10 picoseconds or less.

3. The method of manufacturing the semiconductor device according to claim 1,
    wherein the laser beam has a repetition rate of 10MHz or more.

4. The method of manufacturing the semiconductor device according to claim 1,
    wherein the laser beam which is a fundamental wave is emitted from a laser oscillator which includes a crystal selected from the group consisting of Sapphire, YAG, ceramics YAG, ceramics $Y_2O_3$, KGW, KYW, $Mg_2SiO_4$, YLF, $YVO_4$, and $GdVO_4$,
    wherein at least one of Nd, Yb, Cr, Ti, Ho, and Er is added to the crystal as a dopant.

5. The method of manufacturing the semiconductor device according to claim 1,
    wherein the laser beam has one of a linear shape and an elliptical shape on the irradiation surface.

6. A method of manufacturing a semiconductor device comprising the steps of:
    forming a semiconductor layer over a substrate;
    forming an insulating layer over the semiconductor layer;
    forming a conductive layer over the semiconductor layer with the insulating layer interposed therebetween;
    forming an impurity region in the semiconductor layer;
    emitting a laser beam which is a fundamental wave from a laser oscillator;
    delivering the laser beam onto the semiconductor layer; and
    activating the impurity region by irradiating with the laser beam which generates multiphoton absorption while moving the, surface of the semiconductor layer relatively to the laser beam.

7. The method of manufacturing the semiconductor device according to claim 6,
    wherein the laser beam which is a fundamental wave is oscillated with a pulse width of 1 femtosecond or more and 10 picoseconds or less.

8. The method of manufacturing the semiconductor device according to claim 6,
    wherein the laser beam has a repetition rate of 10 MHz or more.

9. The method of manufacturing the semiconductor device according to claim 6,
    wherein the laser beam which is a fundamental wave is emitted from a laser oscillator which includes a crystal selected from the group consisting of Sapphire, YAG, ceramics YAG, ceramics $Y_2O_3$, KGW, KYW, $Mg_2SiO_4$, YLF, $YVO_4$, and $GdVO_4$,
    wherein at least one of Nd, Yb, Cr, Ti, Ho, and Er is added to the crystal as a dopant.

10. The method of manufacturing the semiconductor device according to claim 6,
    wherein the laser beam has one of a linear shape and an elliptical shape on the irradiation surface.

11. A method of manufacturing a semiconductor device comprising the steps of:
    forming a semiconductor layer over a substrate;
    emitting a laser beam which is a fundamental wave from a laser oscillator;
    delivering the laser beam onto the semiconductor layer; and
    crystallizing the semiconductor layer by irradiating with the laser beam which generates multiphoton absorption while moving the surface of the semiconductor layer relatively to the laser beam;
    forming an insulating layer over the crystallized semiconductor layer;
    forming a conductive layer over the crystallized semiconductor layer with the insulating layer interposed therebetween;
    wherein the laser beam has a peak out power ranging from 1 $GW/cm^2$ to 1 $TW/cm^2$.

12. The method of manufacturing the semiconductor device according to claim 11, wherein the laser beam which is a fundamental wave is oscillated with a pulse width of 1 femtosecond or more and 10 picoseconds or less.

13. The method of manufacturing the semiconductor device according to claim 11,
wherein the laser beam has a repetition rate of 10 MHz or more.

14. The method of manufacturing the semiconductor device according to claim 11,
wherein the laser beam which is a fundamental wave is emitted from a laser oscillator which includes a crystal selected from the group consisting of Sapphire, YAG, ceramics YAG, ceramics $Y_2O_3$, KGW, KYW, $Mg_2SiO_4$, YLF, $YVO_4$, and $GdVO_4$,
wherein at least one of Nd, Yb, Cr, Ti, Ho, and Er is added to the crystal as a dopant.

15. The method of manufacturing the semiconductor device according to claim 11,
wherein the laser beam has one of a linear shape and an elliptical shape on the irradiation surface.

16. A method of manufacturing a semiconductor device comprising the steps of:
forming a semiconductor layer over a substrate;
forming an insulating layer over the semiconductor layer;
forming a conductive layer over the semiconductor layer with the insulating layer interposed therebetween;
forming an impurity region in the semiconductor layer;
emitting a laser beam which is a fundamental wave from a laser oscillator;
delivering the laser beam onto the semiconductor layer; and
activating the impurity region by irradiating with the laser beam which generates multiphoton absorption while moving the surface of the semiconductor layer relatively to the laser beam,
wherein the laser beam has a peak out power ranging from 1 $GW/cm^2$ to 1 $TW/cm^2$.

17. The method of manufacturing the semiconductor device according to claim 16,
wherein the laser beam which is a fundamental wave is oscillated with a pulse width of 1 femtosecond or more and 10 picoseconds or less.

18. The method of manufacturing the semiconductor device according to claim 16,
wherein the laser beam has a repetition rate of 10 MHz or more.

19. The method of manufacturing the semiconductor device according to claim 16,
wherein the laser beam which is a fundamental wave is emitted from a laser oscillator which includes a crystal selected from the group consisting of Sapphire, YAG, ceramics YAG, ceramics $Y_2O_3$, KGW, KYW, $Mg_2SiO_4$, YLF, $YVO_4$, and $GdVO_4$,
wherein at least one of Nd, Yb, Cr, Ti, Ho, and Er is added to the crystal as a dopant.

20. The method of manufacturing the semiconductor device according to claim 16,
wherein the laser beam has one of a linear shape and an elliptical shape on the irradiation surface.

21. A method of manufacturing a semiconductor device comprising the steps of:
forming a conductive layer over a substrate;
forming an insulating layer adjacent to the conductive layer;
forming a semiconductor layer adjacent to the insulating layer;
emitting a laser beam which is a fundamental wave from a laser oscillator;
delivering the laser beam onto the semiconductor layer; and
crystallizing the semiconductor layer by irradiating with the laser beam which generates multiphoton absorption while moving the surface of the semiconductor layer relatively to the laser beam.

22. The method of manufacturing the semiconductor device according to claim 21,
wherein the laser beam which is a fundamental wave is oscillated with a pulse width of 1 femtosecond or more and 10 picoseconds or less.

23. The method of manufacturing the semiconductor device according to claim 21,
wherein the laser beam has a repetition rate of 10 MHz or more.

24. The method of manufacturing the semiconductor device according to claim 21,
wherein the laser beam which is a fundamental wave is emitted from a laser oscillator which includes a crystal selected from the group consisting of Sapphire, YAG, ceramics YAG, ceramics $Y_2O_3$, KGW, KYW, $Mg_2SiO_4$, YLF, $YVO_4$, and $GdVO_4$,
wherein at least one of Nd, Yb, Cr, Ti, Ho, and Er is added to the crystal as a dopant.

25. The method of manufacturing the semiconductor device according to claim 21,
wherein the laser beam has one of a linear shape and an elliptical shape on the irradiation surface.

26. A method for manufacturing a semiconductor device comprising the steps of:
emitting a first laser beam which is a fundamental wave from a laser oscillator;
processing the first laser beam into a second laser beam which is the fundamental wave and which has one of a linear shape and a rectangular shape on an irradiation surface;
irradiating a semiconductor with the second laser beam which is the fundamental wave and which generates a multiphoton absorption.

27. The method according to claim 26, wherein the first laser beam has a repetition rate of 10 MHz or higher.

28. The method according to claim 26, wherein the first laser beam which is a fundamental wave is oscillated with a pulse width of 1 femtosecond or more and 10 picoseconds or less.

29. The method according to claim 26,
wherein the first laser beam is a laser beam emitted from a laser oscillator which includes a crystal selected from the group consisting of Sapphire, YAG, ceramics YAG, ceramics $Y_2O_3$, KGW, KYW, $Mg_2SiO_4$, YLF, $YVO_4$, and $GdVO_4$,
wherein at least one of Nd, Yb, Cr, Ti, Ho, and Er is added to the crystal as a dopant.

30. A laser irradiation apparatus comprising:
a solid state laser oscillator for emitting a laser beam which is a fundamental wave;
a mechanism for projecting and delivering the laser beam which is the fundamental wave onto an irradiation surface, said mechanism including a condenser lens; and
means for moving the irradiation surface relatively to the laser beam which is the fundamental wave,
wherein the condenser lens forms the laser beam which is the fundamental wave into one of a linear shape and an elliptical shape and wherein the laser beam which is the fundamental wave has a repetition rate of 10 MHz or higher.

31. The laser irradiation apparatus according to claim 30, wherein the condenser lens includes two pieces of convex cylindrical lenses.

32. The laser irradiation apparatus according to claim 30, wherein the laser beam emitted from the laser oscillator is oscillated with a pulse width of 1 femtosecond or more and 10 picoseconds or less.

33. The laser irradiation apparatus according to claim 30, wherein the laser beam oscillated from the laser oscillator is emitted from a laser oscillator which includes a crystal selected from the group consisting of Sapphire, YAG, ceramics YAG, ceramics $Y_2O_3$, KGW, KYW, $Mg_2SiO_4$, YLF, $YVO_4$, and $GdVO_4$, wherein at least one of Nd, Yb, Cr, Ti, Ho, and Er is added to the crystal as a dopant.

34. The laser irradiation apparatus according to claim 30, wherein the laser beam has a peak out power ranging from 1 $GW/cm^2$ to 1 $TW/cm^2$.

* * * * *